US006040115A

United States Patent [19]

Bailey et al.

[11] Patent Number: 6,040,115

[45] Date of Patent: Mar. 21, 2000

[54] PROCESSLESS PLANOGRAPHIC PRINTING PLATE

[75] Inventors: David B. Bailey; Mitchell S. Burberry, both of Webster; Mark A. Harris, Rocester, all of N.Y.

[73] Assignee: Kodak Polychrome Graphics LLC, Norwalk, Conn.

[21] Appl. No.: 09/208,520

[22] Filed: Dec. 9, 1998

Related U.S. Application Data

[63] Continuation-in-part of application No. 08/749,050, Nov. 14, 1996, abandoned.

[51] Int. Cl.$^7$ ................................ G03F 7/26; B41N 1/00

[52] U.S. Cl. ....................... 430/303; 430/271.1; 430/944; 430/945; 101/454; 101/462; 101/467

[58] Field of Search ............................. 430/271.1, 278.1, 430/303, 944, 945; 101/462, 454, 467

[56] References Cited

U.S. PATENT DOCUMENTS

| | | | |
|---|---|---|---|
| 3,677,178 | 7/1972 | Gipe | 101/450 |
| 4,077,325 | 3/1978 | Pancnsky | 101/467 |
| 4,078,927 | 3/1978 | Amidon et al. | 430/17 |
| 4,096,294 | 6/1978 | Pacansky | 427/197 |
| 4,718,340 | 1/1988 | Love, III | 101/116 |
| 5,109,771 | 5/1992 | Lewis et al. | 101/453 |
| 5,165,345 | 11/1992 | Lewis et al. | 101/453 |
| 5,168,288 | 12/1992 | Baek et al. | 346/76 |
| 5,244,770 | 9/1993 | DeBoer et al. | 430/200 |
| 5,249,525 | 10/1993 | Lewis et al. | 101/453 |
| 5,310,869 | 5/1994 | Lewis et al. | 430/272.1 |
| 5,339,737 | 8/1994 | Lewis et al. | 101/454 |
| 5,351,617 | 10/1994 | Williams et al. | 101/467 |
| 5,353,705 | 10/1994 | Lewis et al. | 101/453 |
| 5,355,795 | 10/1994 | Moss et al. | 101/141 |
| 5,385,092 | 1/1995 | Lewis et al. | 101/467 |
| 5,417,164 | 5/1995 | Nishida et al. | 101/453 |
| 5,663,037 | 9/1997 | Haley et al. | 430/178.1 |

FOREIGN PATENT DOCUMENTS

| | | | |
|---|---|---|---|
| 1050805 | 3/1979 | Canada | 96/204 |
| 2551746 | 6/1976 | Germany . | |
| 4-301640 | 10/1992 | Japan | G03F 7/00 |
| 4-301641 | 10/1992 | Japan | G03F 7/00 |
| 92/07716 | 5/1992 | WIPO . | |
| 94/18005 | 8/1994 | WIPO . | |

OTHER PUBLICATIONS

Method and Material for the Production of a Dry Planographic Printing PLate, Research Disclosure 19201, Apr. 1980, p. 31.

Direct Method of Producing Waterless Offset Plates by Controlled Laser Beam, N. Necchiporenko and N. Markova, Advances in Printing Science and Technology, Proceedings of the 15th International Conference of Printing Research Institutes, Lillehammer, Norway, Jun. 1979, Pentech Press, London, p. 139–148.

Sources of Background Toning in Waterless Lithography, Gaudioso et al., TAGA Proceedings, p. 174–186, 1976.

Mechanisms of Ink Releases in Waterless Lithography, Gaudioso et al., p. 177–194, TAGA Proceedings, 1975.

Waterless Xerolithographic Printing Masters, Schank et al., p. 120–134, TAGA Proceedings, 1975.

Materials Criteria for Waterless Lithography, Pacansky et al., p. 195–219, TAGA Proceedings 1975.

*Primary Examiner*—Bernard Codd
*Attorney, Agent, or Firm*—Ratner & Prestia

[57] ABSTRACT

A thermally imagable element suitable for use as a lithographic printing plate is disclosed. Imagable element contains an ink repellent, thermally sensitive surface layer on a substrate. The surface layer contains an ink repellent, thermally sensitive co-polymer which is both thermally sensitive and has the physical properties needed for handling and printing. The thermally sensitive co-polymer contains two types of segments: (a) soft silicone segments, which repel ink, and (b) hard segments, which provide physical integrity and impart thermal sensitivity to the co-polymer. The element can be imaged by imagewise expose either by infrared radiation or by heat. The process requires no wet development step and no wiping. Thermally labile crosslinked polymers are also disclosed.

31 Claims, 2 Drawing Sheets

PROCESSLESS PLANOGRAPHIC PRINTING PLATE

CROSS-REFERENCE TO RELATED APPLICATIONS

This application is a continuation-in-part of application Ser. No. 08/749,050, filed Nov. 14, 1996, now abandoned incorporated herein by reference.

FIELD OF THE INVENTION

This invention relates to offset printing. More particularly, this invention relates to digital planographic printing and to a processless imageable element suitable for use as a lithographic printing plate.

BACKGROUND OF THE INVENTION

Dry planography, or waterless printing, is well known in the art of lithographic offset printing and has several advantages over conventional offset printing. Dry planography is particularly advantageous for short run and on-press applications. It simplifies press design by eliminating the fountain solution and aqueous delivery train. Careful ink water balance is unnecessary, thus reducing rollup time and material waste.

An unexposed waterless printing plate typically comprises a layer of ink repellent material over a layer of ink accepting material or an ink accepting surface. Because of their low surface energies and their ability to swell in the long-chain alkane solvents used in printing inks, silicone rubbers, such as poly(dimethylsiloxane) and other derivatives of poly(siloxanes), have long been recognized as preferred waterless-ink repelling materials. Preparation of the printing plate involves the imagewise removal of the ink repellent silicone rubber to expose the underlying ink accepting material or surface.

Various methods of removing the silicone rubber layer have been developed. Imaging with infrared lasers has been described by, for example, Eames, Canadian Patent 1,050, 805, and by N. Nechiporenko and N. Markova, "Advances in Printing Science and Technology," *Proceedings of the 15th International Conference of Printing Research Institutes,* Lillehammer, Norway, June 1979, Pentech Press, London, p. 139–148. The silicone rubber layer is coated over an absorber layer containing a infrared absorbing material in nitrocellulose. Imagewise exposure with an infrared laser partially disrupts the absorber layer, allowing it and the overlying silicone layer to be removed from the exposed regions with a solvent. Infrared imaging has also been described by Lewis, U.S. Pat. Nos. 5,310,869; 5,339,737; 5,385,092; and 5,487,338.

In each these methods, mechanical wiping and/or washing with liquids was required to remove the silicone rubber after exposure. Wiping has several drawbacks. It is difficult to reproducibly remove all stray material with automated cleaning stations. Wiping can scratch and/or abrade the printing plate.

A processless printing plate, i.e., one that does not require a separate processing step to remove the silicone rubber after imaging, would have several advantages. The development step would be eliminated, simplifying the process for preparing the printing plate. If desired, the plate can be exposed on the printing press, which would eliminate damage to the plate caused by handling and mounting on the press after imaging. In addition, any scratching or abrading the plate surface caused by development would be eliminated.

There are three key requirements for an ink repellent polymer to be useful for a thermally-imageable, processless waterless printing plate: the polymer must form a solid film at room temperature to resist damage from the press, it must release ink, and it must be easily removed by the imaging step or by the normal action of the press after imaging. The need for a development step arises from the conflicting need to have wear resistant layers for long press runs while maintaining ease of removal by heat.

In the uncrosslinked form, silicone polymers are either fluids or gums and lack the physical properties needed for handling and printing. Therefore, silicones are generally crosslinked by a number of methods including reactions between silicone hydride and Si-vinyl, reactions between Si—OH or Si—OR groups, and other well known crosslinking chemistries. Although these crosslinks impart robust physical properties to the film, the cross links are not readily broken down by heat, making thermal imaging difficult. A thermally exposed film retains its integrity and is not altered enough to be easily removed. Silicone debris clings to the substrate and to background areas and must be physically wiped away. Polymers with greater thermal sensitivity are required.

A need exists for a thermally-imageable, processless waterless plate in which the ink repellent layer is a polymer that is solid, wear resistant material, but is easily removed either by the imaging step or by the normal action of the press after imaging.

SUMMARY OF THE INVENTION

This invention is a imagable element suitable for use as a lithographic printing plate. The element comprises:

(a) an ink receptive substrate;

(b) an ink repellent, thermally sensitive layer surface overlying the substrate, the layer comprising an ink repellent, thermally sensitive co-polymer;

in which:

the thermally sensitive co-polymer comprises one or more silicone segments and one or more hard segments;

the silicone segments comprise from 50 to 98 weight percent of the co-polymer; and the hard segments provide physical integrity and thermal sensitivity to the thermally sensitive co-polymer.

The elements have several advantages over previous dry planographic systems. They require relatively low exposure and removal of the ink repellent surface layer does not require mechanical wiping or washing with liquids, which reduces scratching or abrading of the plate surface.

DETAILED DESCRIPTION OF THE INVENTION

Figure 1:
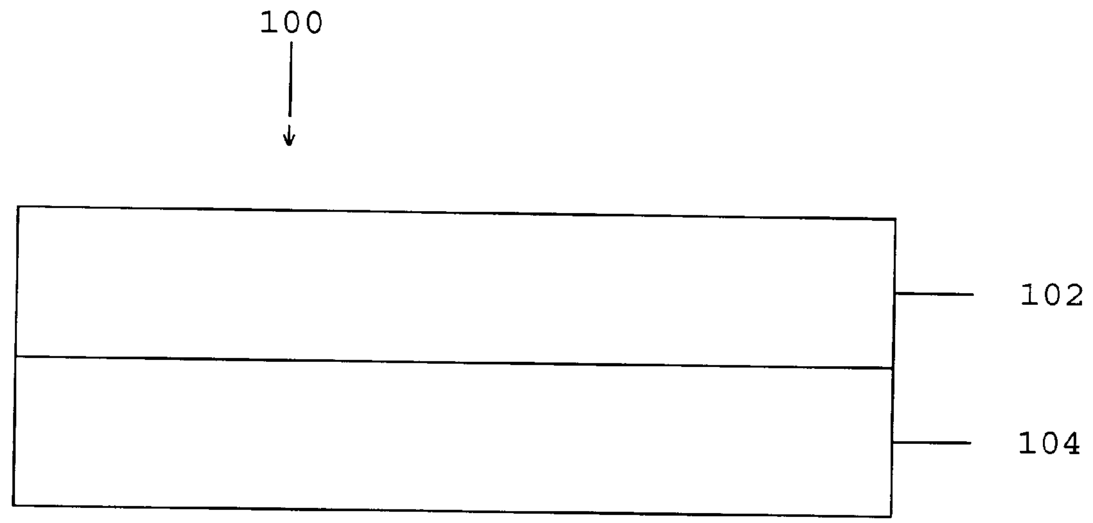
FIG. 1 is a schematic of a layer structure.

Referring to FIG. 1, in one embodiment imagable element 100 comprises ink repellent, thermally sensitive surface layer 102 and substrate 104. Surface layer 102 comprises an ink repellent, thermally sensitive co-polymer. In other embodiments, additional layers may be present, either on the back side of substrate 102, between surface layer 102 and substrate 104, and/or on top of surface layer 102.

Thermally Sensitive Co-polymers

The ink repellent layer comprises a thermally sensitive co-polymer comprising two types of segments: (a) soft silicone segments, which repel ink, and (b) hard segments, which provide physical integrity and impart thermal sensitivity to the co-polymer to provide co-polymers that both are thermally sensitive and have the physical properties needed for handling and printing.

The thermally sensitive co-polymers are represented by:

—H—S— in which H represents the hard segment and S represents the soft silicone segment. The —H—S— designation indicates the two components of the co-polymer and the properties they impart, but does not limit the many architectures by which they may be combined. These would include a diblock co-polymer of —H—S—, triblock co-polymers of —H—S—H— or —S—H—S—, or multiple sequences, as in $(—H—S—)_n$, where n represents the number of sequences. The S segment may be side chains attached to a H main chain, or H side chains may be attached to a S main chain. The side or main chains may also be diblock, triblock or higher multiple sequences of H and S. Multi-armed star architectures, in which the arms are combinations of H and S, are also possible.

The S segment, which is swellable in an ink solvent, is a polysiloxane of the general structure:

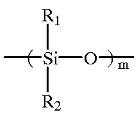

in which m is typically 20 to 10,000; and $R_1$ and $R_2$ are independently organic radicals, typically alkyl radicals such as methyl, aryl such as phenyl, fluoroalkyl, cyanoalkyl, or long ether sequences. $R_1$ and $R_2$ are each preferably methyl or phenyl, more preferably methyl.

Although the co-polymers are mostly linear, there can be branching points or additional functional groups associated with these $R_1$ and $R_2$ groups. Examples of silicone segments are polydimethyl siloxane and polymethy phenyl siloxane. The soft silicone segment generally comprises greater than about 50% of the co-polymer, on a weight basis, and the H segments of the co-polymer generally comprises less than about 50% of the co-polymer, on a weight basis. Preferably, the silicone segment have a molecular weight greater than 4000 and comprises from about 50 to about 98% weight percent of the co-polymer, more preferably about 80% to about 98% by weight of the co-polymer, and most preferably about 90% to about 98% by weight of the co-polymer.

The hard segment imparts two important characteristics to the film, good physical properties and thermal sensitivity. The physical properties are a result of associations between the hard segments which has the effect of crosslinking the film. The associations may include high glass to liquid transition ($T_g$) glassy domains, hydrogen bonding, ionic associations, crystallinity or combinations of these interactions. It may also include but does not necessarily require chemical bonds.

The second attribute of the hard segments is thermal sensitivity. These associations can break down at elevated temperatures more readily than the silicone chain or the silicone crosslinking bonds noted above. Therefore, the integrity of the film can be reduced by laser heating and the resultant silicone layer can be easily removed either during or after exposure by the normal application of the process. The thermal breakdown of associations in the domains may be due to glass to liquid transition, breakdown in hydrogen bonding, melting, breaking of chemical bonds or combinations of these effects.

The hard segments may compose polyurethanes, polyesters, polycarbonates, polyureas, polyimides, polyamic acid, polyamic acid salt, polyamides, epoxides from bisamines and bisepoxides, phenol formaldehyde, urea formaldehyde, melamine formaldehyde, epichlorohydrin-bisphenol A epoxides, Diels-Alder adducts, carbodiimide polymers derived from bisisocyanates, and the wide variety of condensation polymers derived from pairs of difunctional monomers.

Co-polymers in which AA and BB represent two difunctional monomers can be described by:

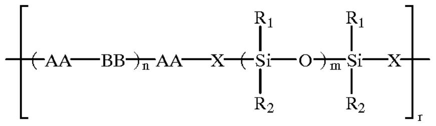

In the case of polyurethane hard segments, AA and BB are derived from diisocyanates and dialcohols. In the case of polyester hard segments, AA and BB are derived from dicarboxylic acids and dialcohols. Polyureas, polycarbonates, polyimides, polyamic acid analogue of the polyimide either as the free acid or in the salt of the acid form, polyamides, and formaldehyde co-polymers can be described in similar fashion. For carbodiimide hard segments, AA and BB would both be diisocyanates. A mixture of AA groups and a mixture of BB groups may be used in the H segments.

In addition to the siloxane groups, the S segment may contain one or more terminal or pendant coupling groups, X, that couple the siloxane portion of the S segment to the H segment. The nature, location and number of the X groups depends on the specific chemistry used to build H and the specific architecture desired.

The X groups can be attached as terminal groups:

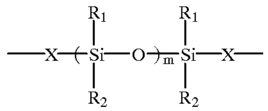

or as pendant groups:

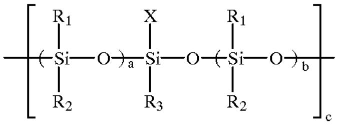

in which $R_3$ is an organic radical, such as methyl or phenyl.

When the X group is attached to each end of the S segment used to form the co-polymer, the number of terminal X groups is equal to the number of S segments in terminal positions. For example, diblock co-polymers have one terminal X group (H—X—S—X), triblocks with H at the center have two terminal X groups (X—S—X—H—S—X), triblocks with S at the center have no terminal X groups (H—X—S—X—H).

The nature of the coupling group X is dependent on the composition of the H segment. X is typically an alkyl or aryl group attached to the silicon atom. The group contains a functional group or groups capable of reacting with the corresponding AA group. For example, when AA is an isocyanate or carboxylate, X would be an alkyl or aryl substituted with a hydroxyl, an amine, or a thiol group. Where AA contains an amino group, a hydroxyl group, or a thiol group, X would be an alkyl or aryl substituted with an isocyanate, a carboxylate, or an epoxy group. Where AA is an methoxy substituted phenol, X would contain a phenolic or urea group.

A variety of functional silicones are available from Gelest, Inc., Tullytown, Pa. These include silicones terminated by aminopropyl, epoxypropoxypropyl, hydroxyalkyl, mercaptopropyl and carboxypropyl groups.

H segments may also be formed from monomers that contain both of the functional groups needed to form the final polymers, such as, p-hydroxybenzoic acid. These monomers are designated as "AB" monomers, to indicate that they contain both functional groups. Coupling of H to S would require a mixture of Y and Z on the siloxane where Y is a carboxylate reactive group such as hydroxyl, amine, thiol, epoxy and X is a hydroxyl reactive group such as carboxylate, isocyanate, etc. Alternatively, the H segment could be capped with a difunctional AA monomer to give an A capped H segment capable of reacting with an X functionalized S segment. These include polyesters, polyamides, phenoxy resins, etc.

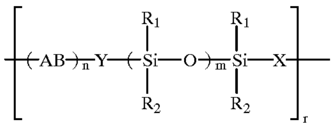

or

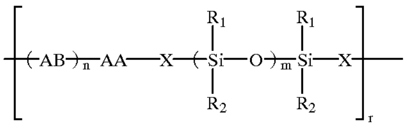

n can be any integer (including 0 if at least one AA or BB is present in the H segment), m can range from 20 to 10,000. n and m bear a relationship such that for large values of n and for large molecular weights of AA, BB, or AB, the substituents $R_1$ and $R_2$ on the silicone and m must be large enough to give the overall structure a silicone content of greater than 50%. The general structure shown represents X and Y as terminal groups and H and S arranged as a multiblock co-polymer. Other architectures (graft, stars, branched or other block sequences) could also be represented by using the appropriate number and location of X coupling groups on the silicone. In the case of highly substituted silicones, the final co-polymer will have a branched structure or crosslinked structure and may, as a practical matter, have to be formed on the substrate during the film forming operation. In the case of linear co-polymers, r represents the multiplicity of the H—S repeat sequence or the overall molecular weight and can range from 1 to about 100, typically from 1 to about 50.

A wide variety of H segments may be prepared in which the H segment is derived from vinyl monomers including acrylates, methacrylates, acrylic acid, methacrylic acid, cyanoacrylates, styrene, alpha-methylstyrene, vinyl esters, vinyl halides, vinylidene halides, maleic anhydride, maleimides, vinyl pyridine, olefins as well as co-polymer mixtures of these monomers. Also, H segments derived from ring opening polymerization monomers such as cyclic ethers, lactams, lactones, and oxazolines, and from carbonyl monomers such as acetaldehyde and phthalaldehyde. These co-polymers can be described by the general formula

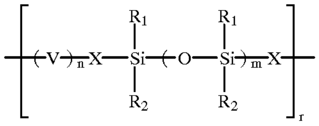

where Vn represents a sequence of the above monomers and X represents the coupling of the H segment containing the Vn sequence to the S segment.

The nature of the X depends on the type of monomer used to form the H segment and its manner of polymerization. In the case of anionic polymerization of the V monomers, the growing anion chain can initiate cyclic siloxane polymerization directly at the silicon atom in which case no X would be required. In the case of a graft architecture, the anionic polymerization of siloxane could be terminated with a vinyl, aldehyde, ether or oxazoline functional group which would subsequently be co-polymerized with V monomer. Also, aminoalkyl terminated siloxanes could initiate the anionic polymerization of N-carboxyanhydrides or of cyanoacrylates. Carboxy or hydroxy terminated siloxanes could initiate polymerization of lactones. Alkyl halide terminated silicones could initiate oxazoline polymerization. A wide variety of vinyl monomer could be polymerized where X represents a radical initiator (such as an azo or peroxide group) attached to the siloxane.

Examples of AA are 1,6-hexamethylenediisocyanate (HMDI), 4,4'-diphenylmethane diisocyanate (MDI), 1-isocyanato-3-isocyanatomethyl-3,5,5-trimethylcyclohexane (IPDI), 2,4 and 2,6-toluene diisocyanate (TDI) and other well known aliphatic and aromatic di- and multifunctional isocyanates.

HMDI $OCN—(CH_2)_6—NCO$

RMDI

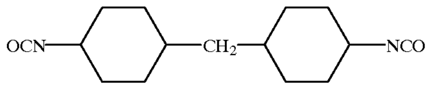

Examples of BB are 4,4'-isopropylidenediphenol (bisphenol A)(GH), 4,4'-isopropylidenebis(2,6-dichlorophenol), 4,4'-isopropylidenebis(2,6-dibromophenol), 4,4'-isopropylidenebis(2-hydroxyethoxybenzene) (AE), 4,4'-(octahydro-4,7-methano-5H-inden-5-ylidene) bis(2-hydroxyethoxybenzene).

GH

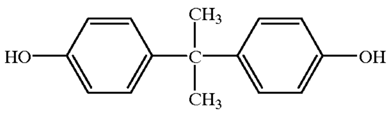

TCBA

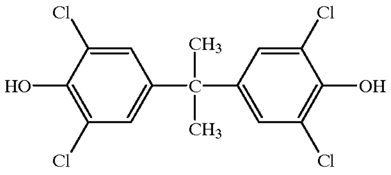

-continued

GY

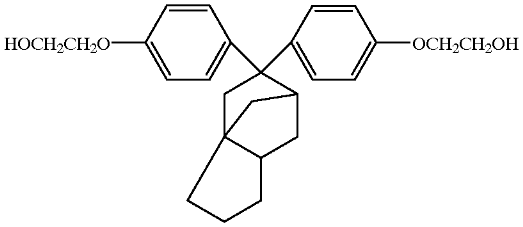

AE

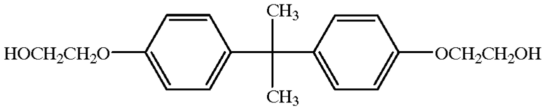

GH

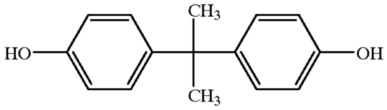

GK

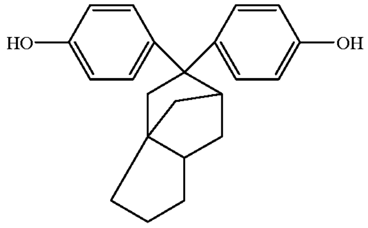

A preferred co-polymer has the formula:

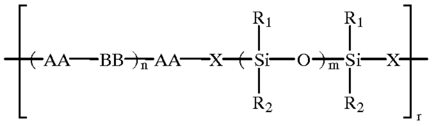

in which AA is derived from a bisisocyanate, preferably 4,4'-dicyclohexylmethane diisocyanate (RMDI); BB is derived from a bisphenol, preferably 4,4'-(octahydro-4,7-methano-5H-inden-5-ylidene) bisphenol (GK); n is about 2 to about 5, preferably about 3; $R_1$ and $R_2$ are methyl; m is about 150 to 200, preferably about 185; and X is derived from an alkyl amine moiety containing one to six carbon atoms, preferably two to four carbon atoms. Most preferably X is derived from $—CH_2CH_2CH_2NH_2$. The amine group reacts with the diisocyanate to couple the H and S components. The polymer structure is repeated r times to produce a higher molecular weight polymer.

The composition of the co-polymer can be adjusted by lengthening or shortening either the number of siloxane repeat units (m) or the number of H repeat units (n) in the silicone segment. The upper end of the molecular weight range is limited only by the reliability of attaching at least one and preferably two or more reactive X groups to the chain, either as terminal or pendant functional groups. The silicone is predominately dimethylsiloxane but may contain substituents other than methyl, including for example phenyl, fluoroalkyl, cyanoalkyl, or long ether sequences groups, to adjust physical properties such as $T_g$. Silicones of 4,450 to 13,700 molecular weight have been prepared in combination with various molecular weight urethane units such that the co-polymer contains from about 60% by weight to about 95% by weight silicone segments.

The urethane segment need not be entirely bisphenol and bisisocyanate and may be filled with a wide variety of diols or diamines which may be monomeric, oligomeric or polymeric.

The structure may be branched or crosslinked if multifunctional reactants are used. In this case, solution gelation would be avoided by completing the reaction during the film drying step. Excess multifunctional isocyanate could be added to react with the urethane or urea linkages to give allophonate or biuret crosslinks. Crosslinking of the silicone segment can be achieved by any one many functional chemistries well known in the art.

Examples of co-polymers are class 1: phenolic urethane (where $R_4$ and $R_5$ are organic radicals)

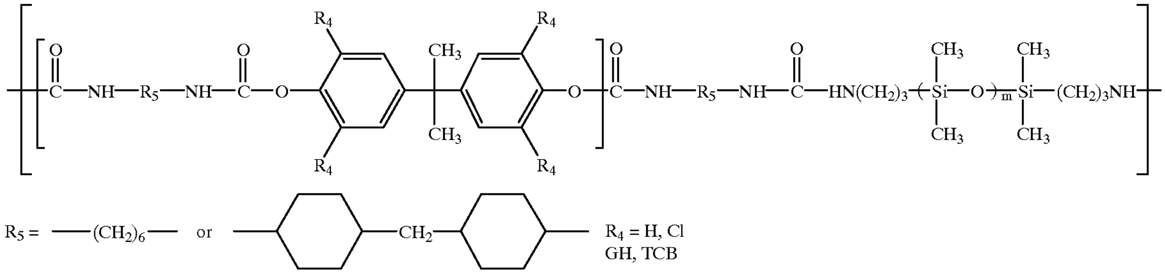

Co-polymer Class 2: aliphatic urethane

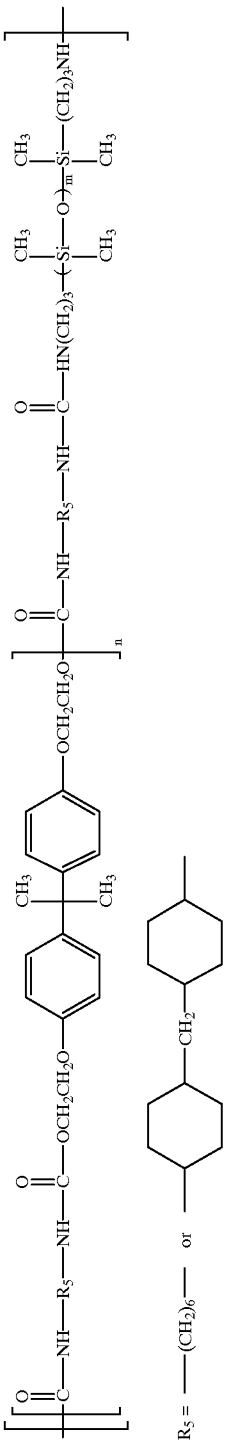

Co-polymer class 3: polyamic acid and salt

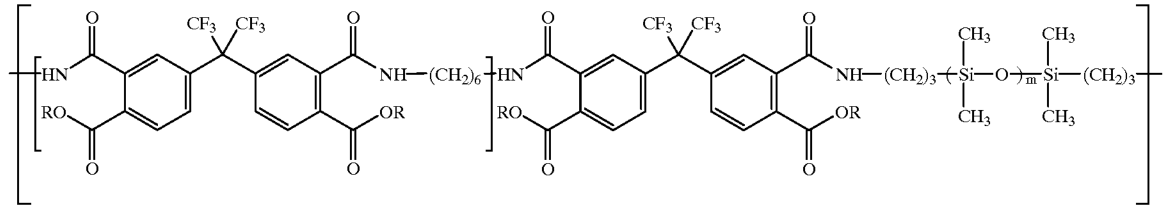

R = H, $^{+}NR_4$

Polyamic acid, salt

Co-polymer class 4: polycarbonates

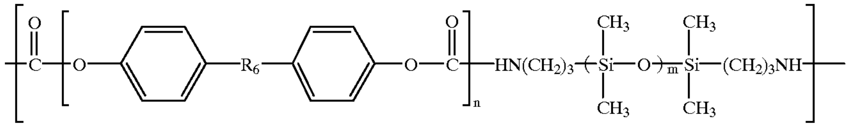

GH

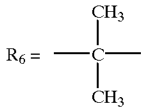

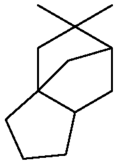

GK

Crosslinked Thermally Sensitive Co-polymers

In one preferred embodiment, the thermally sensitive co-polymers are crosslinked thermally sensitive co-polymers, formed by crosslinking precursor polymers, an ink repellent, thermally sensitive layer overlying the substrate, the layer comprising an ink repellent, thermally sensitive co-polymer, the thermally sensitive co-polymer formed by crosslinking one or more precursors polymers, the precursor polymers comprising a silicone segment comprising siloxane groups and, optionally, one or more coupling groups, and, optionally, one of more HARD segments, the precursor polymer having the structure:

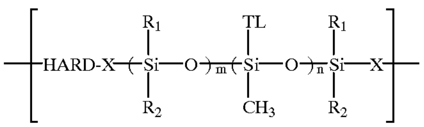

in which:

the HARD segment is derived from a non-silicon polymer; X is a coupling group; $R_1$ and $R_2$ are independently methyl, phenyl, fluoroalkyl, or cyanoalkyl; TL is a group capable of reacting with another TL group, the same or different, to form a thermally labile crosslink; m+n is 4 to 10,000; n is 1 to 1,000, with the proviso that when the silicone segments comprises 100% of the co-polymer, n is at least 2; and the silicone segments comprise greater than 50% of the co-polymer on a weight basis.

The HARD segment can be derived from any non-silicon polymer, including vinyl polymers (such as polystyrenes and acrylates), cellulosic polymers, and condensation polymers. Particularly useful polymers include, but are not limited to, phenolic urethanes, aliphatic urethanes, ureas, polycarbonates, polyamic acids or a salt thereof, polyimides, polyamides, epoxides from bisamines and bisepoxides, phenol formaldehyde, urea formaldehyde, epichlorohydrin-bisphenol A epoxides, carbodiimide polymers derived from bisisocyanates, polyesters and polyureas. Preferred HARD segments are ureas derived from reactions of diisocyanates with amino substituted silicone and urethanes derived from reactions of diisocyanates with a combination of amino-substituted silicones and diols. This segment generally imparts good physical properties and thermal sensitivity to the polymer from the associations between the various HARD segments that effectively strengthen the polymer.

The soft silicone segment contains TL, a thermally labile crosslinking group capable of reacting with another TL group to form a thermally labile crosslink. TL may, for example, be a structure capable of reacting with a similar TL group by undergoing 2+4 cycloaddition reactions to form a Diels-Alder adduct. An example is the cyclopentadiene group, which can couple to form thermally labile dicyclopentadiene adducts.

The overall length of the silicone segment, m+n, may be from 4 to 10,000 and the number of TL sites on the chain, n, may be from 1 to 1,000. In addition to the TL substituted silicone, non-TL substituted silicone may be added to give a mixture of silicones in the silicone segment. The silicone segments comprise greater than 50% of the co-polymer on a weight basis. The total silicone segment may comprise 100% of the co-polymer, in which case the crosslinking via the TL groups are responsible for the physical properties and there is no hard segment to reinforce the network. In this case, the n must be at least 2 to provide a crosslinked network.

TL may represent more than one type of thermally labile crosslinking group. TL may, for example, represent two different groups that react with each other to form a thermally labile crosslink. In this case, the groups may be designed $TL_a$ and $TL_b$, in which $TL_a$ and $TL_b$ are groups the that can react with each other to form a thermally labile crosslink.

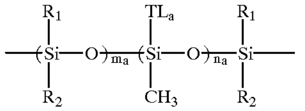

+

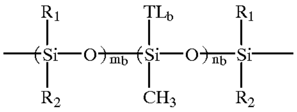

The overall length of the soft segments, $m_a+n_a$ and $m_b+n_b$, may be from 4 to 10,000 and the number of $TL_a$ or $TL_b$ sites on the chain, $n_a$ or $n_b$, may be from 1 to 1,000. Although all the siloxane groups comprising thermally labile crosslinking groups are shown as being adjacent to each other and all the siloxane groups that do not contain thermally labile crosslinking groups are shown as being adjacent to each other, these groups may be randomly distributed in the segment.

As an alternative to the polymeric form of $TL_b$, a terminal or cyclic multi-substituted crosslinking compound may be used. The size of the cyclic ring may be from 3 to 10 and may be mixtures of different size rings. The terminal substituted oligomer may be dimeric (p=2) or of lengths up to p=100. The value of p is preferably 2 to 5, more preferably 2.

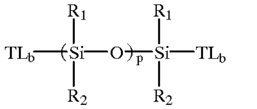

-continued

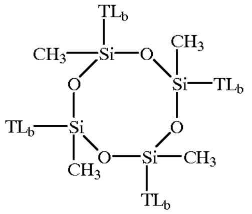

In an even more preferred embodiment, $TL_a$ represents a furan group and $TL_b$ represents a maleimide group. Furan and maleimide groups undergo 2+4 cycloadditions at low temperatures to form an adduct that can be reversed at higher temperatures.

Infrared Absorbing Materials

If the imageable element is to be imaged by exposure with infrared radiation, infrared absorption can be provided by, dyes, pigments, evaporated pigments, semiconductor material, metals, alloys of metals, metal oxides, metal sulfide or combinations of these materials. Many of the surface layers described in U.S. Pat. Nos. 5,109,771; 5,165,345; and 5,249,525 (all of which are hereby incorporated by reference) which contain filler particles that assist the spark-imaging process, can also serve as an infrared absorbing surface layer. The only pigments totally unsuitable as infrared absorber are those whose surface morphologies produce highly reflective surfaces. Thus, white particles such as $TiO_2$ and ZnO, and off-white compounds such as $SnO_2$, owe their light shadings to efficient reflection of incident light, and prove unsuitable for use.

Among the particles suitable as infrared absorbers, direct correlation does not exist between performance in the present environment and the degree of usefulness as a spark-discharge plate filler. Indeed, a number of a compounds of limited advantage to spark-discharge imaging absorb infrared radiation quite well. Semiconductive compounds appear to exhibit, as a class, good performance characteristics. Metal borides, carbides, nitrides, carbonitrides, bronze-structured oxides, and oxides structurally related to the bronze family but lacking the A component (e.g. $WO_{2.9}$) perform well.

Black pigments, such as carbon black, absorb adequately over substantially all of the near infrared and visible region, and can be utilized in conjunction with lasers. Infrared absorbing dyes, such as IR Dye 1 or IR Dye 2, are preferred. Other anions, such as trifluoromethyl sulfonate, may be used in place of the anions present in IR Dye 1 or IR Dye 2.

IR Dye 1

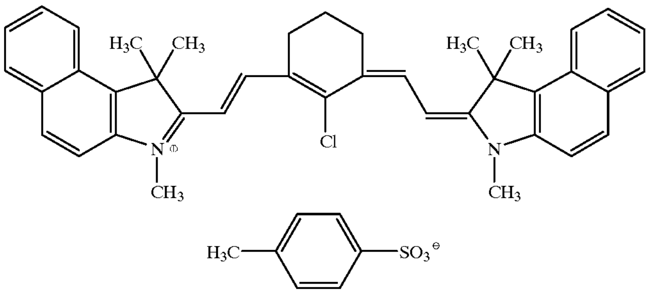

-continued

IR Dye 2

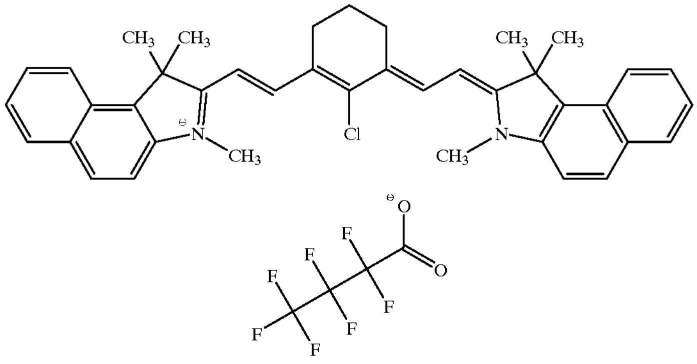

The amount of infrared absorbing material in the layer that absorbs infrared radiation is generally sufficient to provide an optical density of at least 0.05, and preferably, an optical density of from about 0.5 to about 2. Generally, this is at least 0.1 weight percent, and preferably from about 1 to about 30 weight percent.

Substrate

Substrate 104 should resist dimensional change under conditions of use so the color records will register in a full color image. Substrate 104 comprises a base, which provides the required strength, flexibility, and dimensional stability to the imagable element, and, optionally, one or more layers coated on the base. Either the base, or a layer interposed between the base and the ink repellent layer, has an ink receptive surface so that the surface of the substrate underlying the ink repellent layer is ink receptive.

The base of the substrate is preferably strong, stable and flexible. It should resist dimensional change under conditions of use so that color records will register in a full color image. Typically, the base can be any self-supporting material including polymeric films, glass, ceramics, metals, or stiff papers, or a lamination of any of these three materials. Useful bases include polyester films (in the preferred embodiment, Mylar® polyethylene terephthalate film sold by E.I. du Pont de Nemours Co., Wilmington, Del., or, alternatively, Melinex® film sold by ICI Films, Wilmington, Del. or polyethylene napthalate). Aluminum is a preferred metal base. Other metals such as stainless steel may also be used. Paper bases are typically "saturated" with polymerics to impart water resistance, dimensional stability and strength.

The base should be of sufficient thickness to sustain the wear from printing and be thin enough to wrap around a printing form. Polyethylene terephthalate or polyethylene naphthalate, typically has a thickness of from about 100 to about 310 microns, preferably about 175 microns (0.007 in), but thinner and thicker versions can be used effectively. Another preferred embodiment uses aluminum sheet having a thickness of from about 100 to about 600 $\mu$m.

Substrate 104 may consist only of the base or it may comprise one or more optional subbing and/or adhesion layers interposed between the base and the ink repellent layer to improve adhesion of the base to the layer coated thereon. The nature of this layer or layer depends upon the base and the composition of subsequent coated layers. It can be composed of any ink accepting material that can function to improve adhesion of ink repellent, surface layer 102 to substrate 104 and or to improve the ink accepting properties of the imaged element.

Examples of subbing layer materials are adhesion promoting materials, such as alkoxysilanes, aminopropyltriethoxysilane, glycidoxypropyltriethoxysilane and epoxy functional polymers, as well as conventional subbing materials used on polyester bases in photographic films. Homopolymers, co-polymers and polymer blends including poly(vinyl chloride), poly(vinylidene chloride), poly(vinyl chloride-co-vinylidene chloride), chlorinated polypropylene, poly(vinylchloride-co-vinyl acetate), poly (vinyl chloride-co-vinyl acetate-co-maleic anhydride), ethyl cellulose, nitrocellulose, poly(acrylic acid) esters, linseed oil-modified alkyd resins, rosin-modified alkyd resins, phenol-modified alkyd resins, phenolic resins, polyesters, polyisocyanate resins, polyurethanes, poly(vinyl acetate), polyamides, chroman resins, gum damar, ketone resins, maleic acid resins, vinyl polymers such as polystyrene and polyvinytoluene or co-polymers of vinyl polymers with methacrylates or acrylates, low-molecular weight polyethylene, phenol-modified pentaerythritol esters, poly (styrene-co-indian-co-acrylonitrile), poly(styrene-co-indian), poly (styrene-co-acrylonitrile), co-polymers with siloxanes, polyalkenes and poly(styrene-co-butadiene), which may be used either alone or in combination, can be used, as well as polymers containing epoxy, carboxyl, hydroxyl amine functional groups capable of being crosslinked to the next coating layer(s). To increase the adhesion of the overcoat layer, polymers that are crosslinked or branched can be used. For example, there can be used, poly(styrene-co-indene-co-divinylbenzene), poly(styrene-co-acrylonitrile-co-divinylbenzene) or poly(styrene-co-butadiene-co-divinylbenzene). When a metal base is used, subbing layers can also be applied. An infrared absorbing material, such as IR Dye 1 or IR Dye 2, may be included in the subbing or adhesion layer.

The back side of substrate 104 (i.e., the side facing away from the ink repellent layer) may be coated with antistatic agents and/or slipping layers or matte layers to improve handling and "feel" of the imageable element. A protective overcoat may be on either side of substrate 104, as long as the protective overcoat over surface layer 102 is readily ablated along with layer 102, or can be readily removed by the action of the ink and press.

Additional Layers

Figure 2:
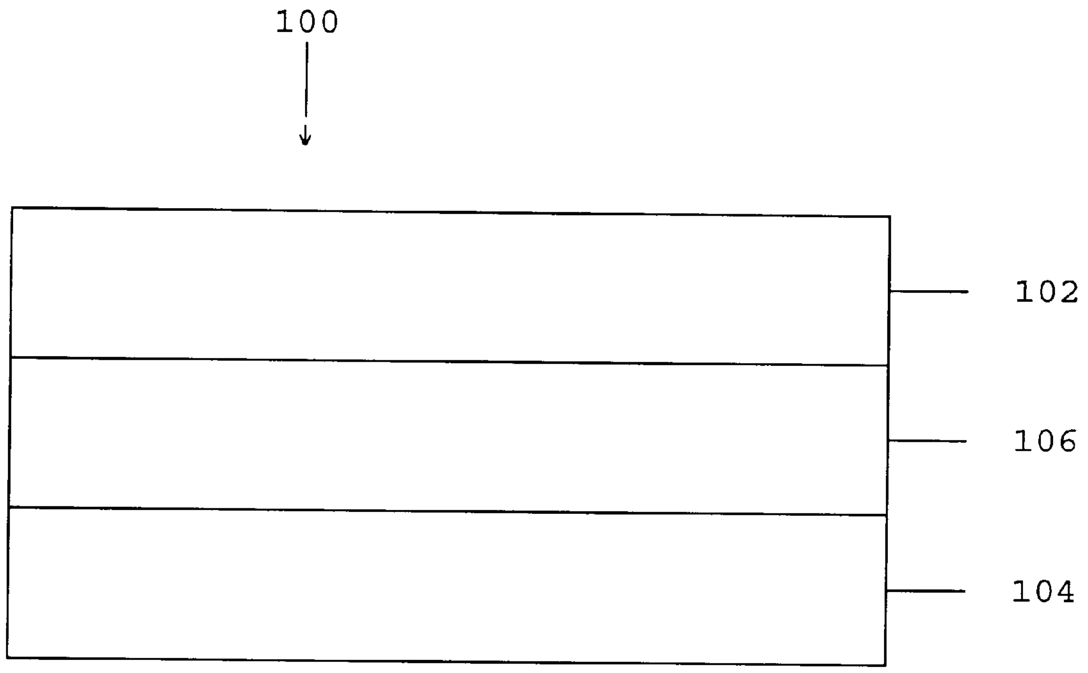
FIG. 2 is a schematic of a preferred layer structure.
Figure 3:
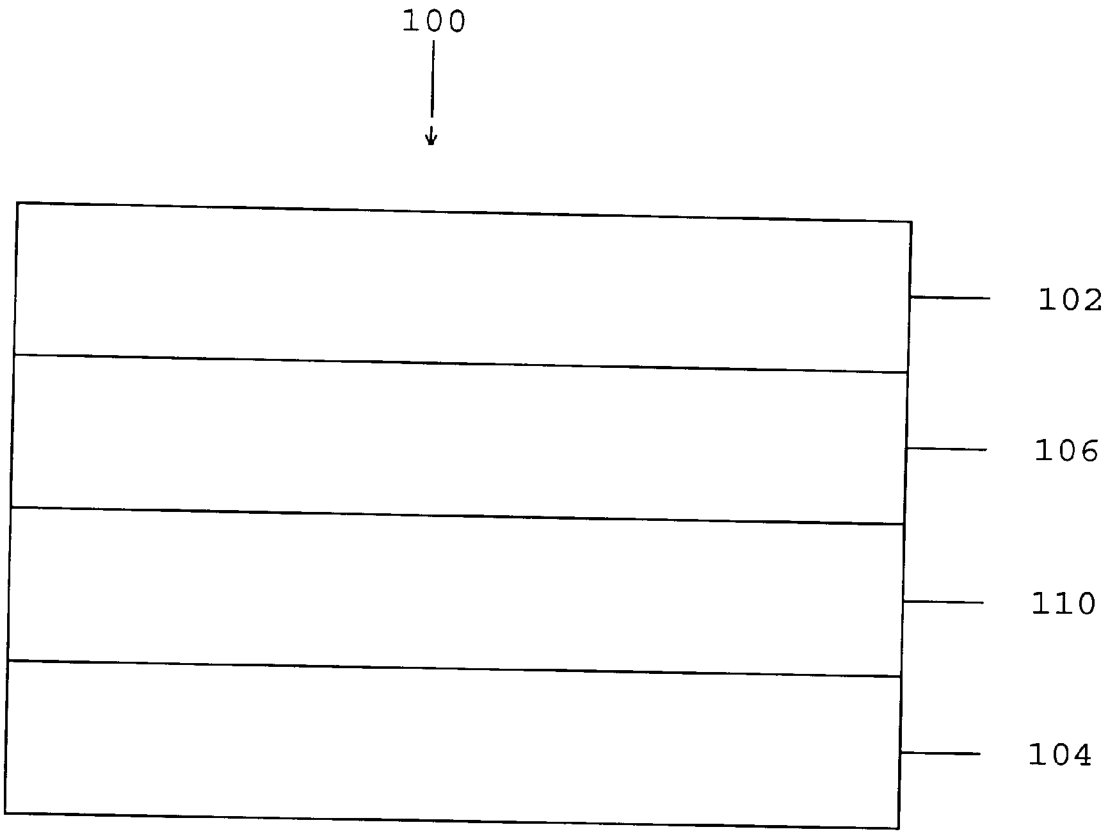
FIG. 3 is a schematic of another preferred layer structure.

The absorbing material can be incorporated into surface layer 102 or it can be in a separate absorber layer or layers interposed between the surface layer 102 and substrate 104, or into substrate 104. FIG. 2 shows a preferred embodiment in which the absorbing material has been incorporated into absorber layer 106. Layer 106 comprises one or more materials that absorb energy from incident imaging radiation. It can comprise a polymeric system that intrinsically absorbs in the region of the imaging radiation's maximum power, or a polymeric coating into which radiation-absorbing components have been dispersed or dissolved. FIG. 3 shows another embodiment in which optional secondary absorption layer 110 is situated between absorbing layer 106 and substrate 104.

Adhesion promoting layers can be interposed between the surface layer and the substrate, between the surface layer and an interposed layer, or between an interposed layers and the substrate. An anti-reflection coating, as disclosed for example in U.S. Pat. No. 5,244,770, can be incorporated at the interface of the absorber layer on the irradiated side of the absorber layer.

When the imagable element is to be imaged by infrared radiation, one or more infrared radiation reflecting layers, such as layers of evaporated metals, can be used. The layer can be incorporated between the ink repellent layer and the substrate, or between the absorber layer and the substrate.

When the element is to be imaged by a thermal head, a slipping layer may be present to improve the heat coupling of the element with the thermal head and to prevent sticking of the head to the surface of the element during imaging. The slipping layer can be composed of any ink repelling material such as, silicone oil, or polyvinyl-block-siloxane co-polymers, such as those described in U.S. Pat. No. 5,627,130. The slipping layer does not interfere with printing because is removed by the printing operation.

Manufacture

The ink repellent, thermally sensitive co-polymer can be precoated on a suitable substrate or it can be sprayed, painted or coated on a reusable drum, plate or sleeve on press. The layer or layers of the imagable element are coated onto the substrate using any suitable equipment and procedure, such as spin coating, knife coating, gravure coating, dip coating or extrusion hopper coating. The imageable element can be of any useful form including, but not limited to, printing plates, printing cylinders, printing sleeves, and printing tapes (including flexible printing webs). Imagable elements can be of any useful size and shape (for example, square or rectangular) having the requisite layers disposed on a suitable metal or polymeric substrate. Printing cylinders and sleeves are rotary-printing members having the substrate and requisite layers in a cylindrical form. Hollow or solid metal cores can be used as substrates for printing sleeves.

Imaging

To be directly imageable by modulated infrared radiation, it is only necessary that the combination of laser intensity, exposure time and absorption strength is sufficient to heat and thus remove, partially remove, or disrupt ink repellent, surface layer 102. Complete removal of ink repellent, surface layer 102 is not required. It is only necessary that the ink receptive surface of the substrate 104 be revealed in the exposed areas under normal press conditions while ink repellent, surface layer 102 remains intact in the background areas.

For imaging the imageable elements with modulated infrared radiation, a suitable imaging apparatus includes at least one laser device that emits in the region of maximum plate responsiveness, i.e. whose $\lambda_{max}$ closely approximates the wavelength region where the imagable element absorbs most strongly. Specifications for lasers that emit in the near-infrared region are fully described in the U.S. Pat. No. 5,339,737; lasers emitting in other regions of the electromagnetic spectrum are well-known to those skilled in the art.

Suitable imaging configurations are also set forth in detail in the U.S. Pat. No. 5,339,737. Briefly, laser output can be provided directly to the surface of the imagable element via lenses or other beam-guiding components, or transmitted to the surface of the imagable element from a remotely sited laser using a fiber-optic cable. A controller and associated positioning hardware maintains the beam output at a precise orientation with respect to the surface, scans the output over the surface, and activates the laser at positions adjacent selected points or areas of the imagable element. The controller responds to incoming image signals corresponding to the original document or picture being copied onto the element to produce a precise negative or positive image of the original.

To be directly imageable with a thermal head it is only necessary that the combination of heat and time is sufficient to remove, partially remove, or disrupt at least one coated layer. Complete removal of ink repellent, surface layer 102 is not required. It is only necessary that the ink receptive surface of the substrate 104 be revealed in the exposed areas under normal press conditions while ink repellent, surface layer 102 remains intact in the background areas. An apparatus is described in U.S. Pat. No. 5,488,025, The thermal head can be incorporated in a printing press to create the imaged element, useful as a printing plate, on the impression cylinder(s) in color register or can be incorporated in a stand alone device. Imaging apparatus suitable for use in conjunction with the imagable elements includes at least one thermal head but would usually include a thermal head array such as a TDK Model No. LV5416 used in thermal fax machines and sublimation printers.

Briefly, thermal output can be provided directly to the surface of the imagable element via direct contact with the thermal head. A controller and associated positioning hardware maintains the thermal output at a precise orientation with respect to the element surface, scans the output over the surface, and activates the thermal head at positions adjacent to selected points or areas of the element. The controller responds to incoming image signals corresponding to the original document or picture being copied onto the element to produce a precise negative or positive image of that original.

In either case, the image signals are stored as a bitmap data file on a computer. Such files may be generated by a raster image processor (RIP) or other suitable means. For example, a RIP can accept input data in page-description language, which defines all of the features required to be transferred onto the imagable element, or as a combination of page-description language and one or more image data files. The bitmaps are constructed to define the hue of the color as well as screen frequencies and angles.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the imagable element mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam or the thermal head and the imagable element is achieved by rotating the drum (and the imagable element mounted thereon) about its axis and moving the beam or head parallel to the rotation axis, thereby scanning the element circumferentially so the image "grows" in the axial direction. Alternatively, the beam or head can move parallel to the drum axis and, after each pass across the imagable element, increment angularly so that the image on the imagable element "grows" circumferentially. In either case, an image corresponding (positively or negatively) to the original image is applied to the surface of the imagable element.

In the flatbed configuration, the beam or head is drawn across either axis of the imagable element, and is indexed along the other axis after each pass. Of course, the requisite relative motion between the beam or head and the imagable element may be produced by movement of the imagable element rather than (or in addition to) movement of the beam or head.

Regardless of the manner in which the beam or head is scanned, it is generally preferable (for on-press applications) to use a plurality of lasers or thermal heads and guide their outputs to a writing array. The writing array is then indexed, after completion of each pass across or along the imagable element, a distance determined by the number of beams or heads emanating from the array, and by the desired resolution (i.e., the number of image points per unit length). Off-press applications, which can be designed to accommodate very rapid element movement (e.g., through use of high-speed motors) and thereby utilize high laser pulse rates, can frequently utilize a single laser as an imaging source.

INDUSTRIAL APPLICABILITY

The invention is a thermally imagable element, suitable for use as a lithographic printing plate. It can be imaged by imagewise, thermal exposure either by infrared radiation or by heat. "Thermal exposure" means expose either by infrared radiation (e.g., by a modulated infrared laser) or by heat (e.g., by a thermal head).

The element can be imaged by a process that requires no wet development step and no wiping. It is well-suited for use either with relatively inexpensive and reliable high power diode lasers, Nd/YAG lasers infrared lasers, or with relatively inexpensive and reliable thermal heads, such as those used in thermal fax applications and dye sublimation thermal printers. The process of using the element comprises imaging the ink repellent layer and applying ink to the imaged element or printing plate, whereby ink is repelled from the portions of the element that were not imaged. The element is well suited for imaging in a plate setter or directly on press.

The advantageous properties of this invention can be observed by reference to the following examples which illustrate, but do not limit, the invention.

EXAMPLES

Glossary

| Glossary | |
|---|---|
| AE | 4,4'-Isopropylidenebis(2-hydroxyethoxybenzene) |
| FC431 | Nonionic fluorochemical surfactant (3M Specialty Chemicals, St. Paul, MN) |
| GH | Bisphenol A; 4,4'-Iso-propylidenediphenol |
| GK | 4,4'-(Octahydro-4,7-methano-5H-inden-5-ylidene)bisphenol |
| GY | 4.4'(Octahydro-4,7-methano-5H-inden-5-ylidene)bis(2-hydroxyethoxybenzene) |
| HMDI | Hexamethylene Diisocyanate |
| IR Dye 1 | 2-[2-{2-Chloro-3-[(1,3-dihydro-1,1,3-trimethyl-2H-benz[e]indol-2-ylidene)ethylidene]-1-cyclohexe-1-yl}ethenyl]-1,1,3-trimethyl-1H-benz[e]indolium salt of 4-methylbenzenesulfonic acid |
| IR Dye 2 | 2-[2-{2-Chloro-3-[(1,3-dihydro-1,1,3-trimethyl-2H-benz[e]indol-2-ylidene)ethylidene]-1-cyclohexe-1-yl}ethenyl]-1,1,3-trimethyl-1H-benz[e]indolium salt of perfluorobuturic acid |
| IR Dye 3 | 2-[2-{2-Chloro-3-[(1,3-dihydro-1,1,3-trimethyl-2H-benz[e]indol-2-ylidene)ethylidene]-1-cyclohexe-1-yl}ethenyl]-1,1,3-trimethyl-1H-benz[e]indolium salt of trifluoromethyl sulfonic acid |
| PS 120 | Polymethylhydrosiloxane crosslinker (United Chemical Technologies, Bristol, PA) |
| PS 255 | Polydimethyl silicone gum with 0.1–0.3% vinyl functionality (United Chemical Technologies, Bristol, PA) |
| PS 448 | Polydimethylsiloxane, vinyldimethyl terminated (United Chemical Technologies, Bristol, PA) |
| RMDI | 4,4'-Dicyclohexylmethane diisocyanate |
| SIP6831 | Platinum divinyltetramethyl disiloxane complex in xylene (Gelest Chemicals, Tullytown, PA) |
| SIT-7900 | 1,3,5,7-tetravinyl-1,3,5,7-tetramethyl cyclotetrasiloxane diluted to make a 10% solution (Gelest Chemicals, Tullytown, PA) |
| TCBA | Tetrachlorobisphenol A |

Imaging with Infrared Radiation

A thermal infrared lathe type printer similar to that described in Baek, U.S. Pat. No. 5,168,288, was used to image the imagable elements. The elements were exposed using approximately 450 mW per channel, 9 channels per swath, 945 lines/cm (2400 lines/in), a drum circumference of 53 cm and approximately 25 micron diameter spot ($1/e^2$) at the image plane. The test image included text, positive and negative lines, half-tone dot patterns and half-tone image. Images were printed at speeds up to 1100 revolutions per minute. These exposure levels do not necessarily corresponding to the optimum exposure for these elements.

Imaged elements were printed, without wiping or further processing, using an AB Dick 9870 duplicator, without the fountain roller or fountain solution. No special temperature control was used in this test. Waterless ink, K50-95932-Black (INX International Rochester, N.Y.) was used for printing.

Example 1

The example demonstrates a general procedure for the preparation of a thermally sensitive co-polymer.

A 100 mL flask was charged with 0.67 g of RMDI, 0.61 g of GK, 10 mL of toluene and 5 mL of tetrahydrofuran and 1 drop of dibutyl tin dilaurate catalyst. The solution was heated for 1 hour at 50° C. A solution of 8.72 g of a difunctional aminopropyl terminated silicone of 13,700 molecular weight in 8.7 g of toluene (Dow Corning) was added and the mixture heated with stirring for 16 hours at 55° C. The polymer solution was used without further purification. Molecular weight (size exclusion chromatography) 26,600.

Example 2

This example demonstrates that thermally sensitive co-polymers with as little as 72% by weight silicon are useful for repelling waterless ink.

Thermally sensitive co-polymers of the formula:

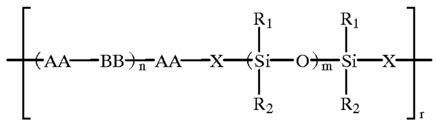

in which $R_1$ and $R_2$ are each methyl and X is a urethane linkage derived from reaction of the terminal aminopropyl group of the S segment with the isocyanate indicated in Table 1, were prepared as described in Example 1. The properties are give in Table 1.

TABLE 1

| Polymer | PDMS[a] (MW) | AA | BB | n | Co-polymer (MW) |
|---|---|---|---|---|---|
| 171A | 4,450 | HMDI | TCBA | 1 | 95,000 |
| 171B | 13,700 | HMDI | TCBA | 1 | 78,000 |
| 171C | 4,450 | HMDI | TCBA | 3 | 104,000 |
| 171D | 13,700 | HMDI | TCBA | 3 | 67,000 |

[a]Molecular weight of the aminopropyl dimethylsiloxane precursor used the synthesis of the co-polymer.

Solutions of thermally sensitive co-polymers 171A–D at 15% solids were prepared in toluene and coated onto substrate of 100 micron polyester base using a knife blade with a 25 micron spacing resulting in an ink repellant, thermally sensitive layer of 3.23 g/m$^2$. Properties of the thermally sensitive layers are given in Table 2.

TABLE 2

| Element | Co-polymer | % silicone in co-polymer | Wet thickness |
|---|---|---|---|
| 1 | 171A | 86% | 25 micron |
| 2 | 171B | 95% | 25 micron |
| 3 | 171C | 72% | 25 micron |
| 4 | 171D | 89% | 25 micron |

Each element was tested for inking properties with waterless ink K50-95932-Black available from INX international Rochester NY A handheld roller was loaded with ink and passed over the coating to test ink adhesion. The ink did not stick to any of the thermally sensitive surface layers but does adhere to the uncoated polyester substrate.

Example 3

This example shows the preparation of imagable elements from the thermally sensitive co-polymers prepared in Example 2 and that co-polymers that are rich in PDMS and high PDMS molecular weight can resist toning yet can be exposed and printed without the need for wiping.

Imagable elements were prepared by coating solutions of thermally sensitive co-polymers 171A, B, C and D prepared as follows:

| | |
|---|---|
| Co-polymer (15% solution) | 11.40g |
| Toluene | 5.23g |
| IR Dye 2 (3% solution in 50:50 toluene:tetrahydrofuran) | 8.56g |

The solutions were coated at 10.8, 16.1, 21.6 and 32.3 mL/m$^2$ using a slot hopper coater. A 100 micron polyester base was used as the substrate.

A control coating, # 21, without absorber, was prepared from toluene and coated at 10.8 mL/m$^2$:

| | |
|---|---|
| PS 448 (10% solution in toluene) | 4.89 g |
| PS120 (5% solution) | 0.37 g |
| SIT-7900 (10% solution) | 0.37 g |
| SIP-6831 (1% solution) | 0.37 g |
| Toluene | 3.90 g |

A second control coating, # 22, containing an absorber for infrared radiation, was prepared and coated at 10.8 mL/m$^2$:

| | |
|---|---|
| PS 448 (10% solution in toluene) | 4.89 g |
| IR Dye 2 (3% solution) | 2.45 g |
| PS120 (5% solution) | 0.37 g |
| SIT-7900 (10% solution) | 0.37 g |
| SIP-6831 (1% solution) | 0.37 g |
| Toluene | 1.45 g |

The infrared dye solution was prepared in 50:50 toluene/tetrahydrofuran. The other components were prepared in toluene.

TABLE 3

Laydown series with co-polymers 171A through 171D

| Element | Wet laydown mL/m$^2$ | Co-polymer | % PDMS[a] |
|---|---|---|---|
| 5 | 10.8 | 171A | 75% |
| 6 | 16.1 | 171A | 75% |
| 7 | 21.6 | 171A | 75% |
| 8 | 32.3 | 171A | 75% |
| 9 | 10.8 | 171B | 83% |
| 10 | 16.1 | 171B | 83% |
| 11 | 21.6 | 171B | 83% |
| 12 | 32.3 | 171B | 83% |
| 13 | 10.8 | 171C | 63% |
| 14 | 16.1 | 171C | 63% |
| 15 | 21.6 | 171C | 63% |
| 16 | 32.3 | 171C | 63% |
| 17 | 10.8 | 171D | 77% |
| 18 | 16.1 | 171D | 77% |
| 19 | 21.6 | 171D | 77% |
| 20 | 32.3 | 171D | 77% |
| 21 | 32.3 | PS 448 | 96% |
| 22 | 32.3 | PS 448 | 85% |

[a]Weight percent polydimethylsiloxane in the coated layer after drying.

Each of the elements was imaged as described above, using an 830 nm infrared laser from 500 to 1200 mJ/cm$^2$, to form an imaged element. With the exception of element 21, each of the imaged elements showed a visual color change after imaging. With the exception of elements 11, 12, 21 and 22, each of the imaged elements produced prints for the entire exposure range. Imaged elements 11 and 12 produced a printed image for only the highest exposures. Imaged element 21 did not produce a printed image because the surface layer is transparent to the infrared radiation. Imaged element 22, a PDMS control with absorber only, produced a partial blotchy image. Severe toning (ink in non-image areas) was observed with imaged elements 13, 14, 15 and 16, which have the lowest molecular weight PDMS and the lowest PDMS content.

Example 4

Imagable elements were prepared from various siloxane polymers and co-polymers. Coatings were prepared as follows from dichloromethane using a doctor knife with a 25 micron spacing:

| | |
|---|---|
| Co-polymer (10% solution) | 7.14 g |
| Solvent | 7.36 g |
| IR Dye 1 (10% solution) | 0.50 g |

After coating, the surface layers were evaluated for film forming properties by rubbing with a fingertip. Those that were unchanged by the rubbing were considered to be solid films. The ink repellent nature of these layers was evaluated by applying waterless ink from a handheld roller in the manner discussed in Example 2.

The elements were imaged and printed using waterless ink in a manner described above. Those that resulted in a clean press sheet in the unexposed areas after 100 impressions were considered ink releasing. In the exposed areas, the imaged elements that reproduced the image without additional processing or wiping were considered useful materials.

Element 23 is an element of the invention. Element 24 contains a crosslinked silicone polymer that does not that an H segment. Elements 25 and 28 contain soft silicone polymers. Element 26 contains a film forming silicone polymer containing no hard segment that does not release ink. Elements 29 and 30 contain co-polymers in which the non-silicone segments do not impart strong enough associations to result in film formation.

TABLE 4

| Element | Polymer[a] | % silicone in polymer | Solid Film @ Room Temp | Ink Release | Reproduced image |
|---|---|---|---|---|---|
| 23 | Invention material 171B | 87% | Yes | Yes | Yes |
| 24 | PS 448, cured | 100% | Yes | Yes | No |
| 25 | PS 448, uncured | 100% | No | — | — |
| 26 | PS 130 | 100% | Yes | No | — |
| 27 | PS 828 | 97% | No | — | — |
| 28 | Dow 2616 | 97% | No | — | — |
| 29 | DBE-712 | 25% | No | — | — |
| 30 | DBE-224 | 75% | No | — | — |

[a]PS 130 is polymethylocadecyl siloxane from Huls America, Inc. PS 828 is 97% dimethyl 3% epoxycyclohexylethyl siloxane gum from Huls America, Inc. Dow 2616 is amine terminated dimethyl siloxane. DBE-712 is dimethyl siloxane-ethylene oxide block co-polymer, 25% siloxane content 600 MW from Gelest, Inc. DBE-224 is dimethyl siloxane-ethylene oxide block co-polymer, 75% siloxane content 10,000 MW from Gelest, Inc.

Example 5

Based upon the general formula described above, the following co-polymers were prepared.

TABLE 5

| Co-polymer | PDMS (MW) | AA | BB | n | % silicone in co-polymer |
|---|---|---|---|---|---|
| 6A | 4450 | RMDI | GY | 1 | 83% |
| 6B | 13,700 | RMDI | AE | 1 | 94% |
| 6C | 4450 | RMDI | AE | 3 | 69% |
| 6D | 13700 | RMDI | GY | 3 | 86% |
| 6E | 4450 | HMDI | AE | 1 | 87% |
| 6F | 13,700 | HMDI | GY | 1 | 95% |
| 6G | 4450 | HMDI | GY | 3 | 70% |
| 6H | 13700 | HMDI | AE | 3 | 89% |

Coating solutions were prepared using the formula below.

| | |
|---|---|
| Co-polymer (20% solution in 50:50 toluene:tetrahydrofuran) | 3.67 g |
| IR Dye 1 (5% solution in 50:50 toluene: methanol) | 1.03 g |
| FC431 (5% solution in toluene) | 0.06 g |
| Toluene | 2.62 g |
| Tetrahydrofuran | 2.62 g |

Imagable elements were prepared by slot hopper coating solutions at 25.4 $mL/m^2$ onto a 100 micron polyester substrate. A 1.61 $g/m^2$ surface layer was obtained after drying. Each element was imaged as described above.

TABLE 6

| Element | Co-polymer | Laydown | % PDMS | Print $D_{min}$ |
|---|---|---|---|---|
| 31 | 6A | 1.61 $g/m^2$ | 77% | 0.25 |
| 32 | 6B | 1.61 $g/m^2$ | 88% | 0.09 |
| 33 | 6C | 1.61 $g/m^2$ | 65% | 0.35 |
| 34 | 6D | 1.61 $g/m^2$ | 81% | 0.08 |
| 35 | 6E | 1.61 $g/m^2$ | 82% | 0.12 |
| 36 | 6F | 1.61 $g/m^2$ | 89% | 0.14 |
| 37 | 6G | 1.61 $g/m^2$ | 66% | 0.53 |
| 38 | 6H | 1.61 $g/m^2$ | 83% | 0.09 |

Upon printing on an offset press as described in Example 2, each of the imaged elements produced a visible printed image for exposures over 600 $mJ/cm^2$. After 2000 impressions, prints from imaged elements 32, 34, 35, 36 and 38 exhibited clean backgrounds free from toning as shown by the print $D_{min}$. This demonstrates that surface layers comprising co-polymers with high silicone content and high molecular weight silicone blocks are superior for resistance to toning.

Example 6

Multilayer imagable element were prepared using the co-polymers described in Example 5 in combination with a layer consisting of a dispersion of nitrocellulose and carbon particles prepared as follows.
Nitrocellulose and Carbon Dispersion:

| | |
|---|---|
| n-Butyl Acetate | 66 parts |
| Iso-Propyl alcohol | 7.2 parts |
| Carbon black | 10 parts |
| Nitrocellulose | 16.8 parts |

A coating solution was prepared by mixing 16.4 g of in 83.6 g of ethyl acetate. The nitrocellulose was a low viscosity version. Carbon black was Black Pearls 450 (Cabot). The dispersion was milled using zirconium beads for 1 week. The dispersion was coated onto a polyester substrate 21.5 mL/m$^2$.

Solutions of co-polymers 6A through 6H were prepared by adding 3.32 g of co-polymer (20% solution in 50:50 toluene:tetrahydrofuran) to 11.68 g of dichloromethane. The solutions were coated over the nitrocellulose layers at 25.4 mL/m$^2$ using a coating knife with a 25.4 micron spacing. After drying, the elements were imaged as described above.

TABLE 7

| Element | Top layer co-polymer | Dry coverage | $D_{min}$ |
|---|---|---|---|
| 39 | 6A | 1.61 g/m$^2$ | 0.50 |
| 40 | 6B | 1.61 g/m$^2$ | 0.09 |
| 41 | 6C | 1.61 g/m$^2$ | 0.58 |
| 42 | 6D | 1.61 g/m$^2$ | 0.11 |
| 43 | 6E | 1.61 g/m$^2$ | 0.44 |
| 44 | 6F | 1.61 g/m$^2$ | 0.28 |
| 45 | 6G | 1.61 g/m$^2$ | 0.76 |
| 46 | 6H | 1.61 g/m$^2$ | 0.10 |

After imaging, the imaged elements were printed without additional processing or wiping on an offset press using waterless ink. Each of the imaged elements produced prints with visible images. After 2000 impressions, prints from elements 40, 42 and 46 exhibited clean backgrounds free from toning. Only the materials rich in PDMS with a high PDMS molecular weight were acceptable.

Example 7

This example shows that thermally sensitive co-polymers can be blended with silicone polymers to produce imagable elements that are imagable without wiping to produce imaged elements that are resistant to toning.

A presolution of crosslinkable poly(dimethyl siloxane) was prepared as follows:

| | |
|---|---|
| PS 255 | 8.6 parts |
| PS 120 | 0.087 parts |
| SIT-7900 | 0.32 parts |
| SIP6831 | 0.017 parts |
| Toluene | 0.9 parts |

Coating solutions were prepared adding co-polymer presolution and the PS 255 presolution. IR Dye 2 was added to the solution at a level required to provide a 0.32 g/m$^2$ coverage. Coatings were made at 50.8 mL/m$^2$ using a knife blade coater.

TABLE 8

| Element | Co-polymer 171C g/m$^2$ | PS 255 g/m$^2$ | IR Dye 2 g/m$^2$ | % Co-polymer 171C |
|---|---|---|---|---|
| 47 | 0.54 | 1.61 | 0.32 | 25% |
| 48 | 0.81 | 0.81 | 0.32 | 50% |
| 49 | 1.61 | 0.54 | 0.32 | 75% |

After imaging as described above, the imaged elements were printed on an offset press using waterless ink without the use of fountain solution or any processing. Imaged element 47 had a visible image after 50 sheets and did not show any background toning when the run was stopped at 2000 impressions.

TABLE 9

| Element | 1st image | Toning (# sheets) |
|---|---|---|
| 47 | 50 | >2000 |
| 48 | 1000 | 500 |
| 49 | 5 | 40 |

Example 8

Based upon the general formula described above, additional co-polymers were prepared.

TABLE 10

| Co-polymer | PDMS (MW) | AA | BB | n | % silicone in co-polymer |
|---|---|---|---|---|---|
| 11A | 4450 | RMDI | GK | 1 | 84% |
| 11B | 13,700 | RMDI | GH | 1 | 95% |
| 11C | 4450 | RMDI | GH | 3 | 72% |
| 11D | 13700 | RMDI | GK | 3 | 87% |
| 11E | 4450 | HMDI | GH | 1 | 89% |
| 11F | 13,700 | HMDI | GK | 1 | 95% |
| 11G | 4450 | HMDI | GK | 3 | 73% |
| 11H | 13700 | HMDI | GH | 3 | 91% |

Imagable elements were prepared by slot hopper the coating solutions described below at 25.4 mL/m$^2$ onto a substrate of 100 micron polyester base. A 1.61 g/m$^2$ ink repellant, thermally sensitive layer was obtained after drying. Each element was imaged as described above.

| | |
|---|---|
| Co-polymer (20% solution in 50:50 toluene:tetrahydrofuran) | 3.67 g |
| IR Dye 1 (5% solution in 50:50 toluene: methanol) | 1.03 g |
| FC431 (5% solution in toluene) | 0.06 g |
| Toluene | 2.62 g |
| Tetrahydrofuran | 2.62 g |

TABLE 11

| Element | Co-polymer | Laydown | % PDMS | Print $D_{min}$ |
|---|---|---|---|---|
| 50 | 11A | 1.61 g/m$^2$ | 77% | 0.34 |
| 51 | 11B | 1.61 g/m$^2$ | 88% | 0.13 |
| 52 | 11C | 1.61 g/m$^2$ | 65% | 0.41 |
| 53 | 11D | 1.61 g/m$^2$ | 81% | 0.12 |
| 54 | 11E | 1.61 g/m$^2$ | 82% | 0.37 |
| 55 | 11F | 1.61 g/m$^2$ | 89% | 0.10 |
| 56 | 11G | 1.61 g/m$^2$ | 66% | 0.55 |
| 57 | 11H | 1.61 g/m$^2$ | 83% | 0.12 |

Upon printing on a offset press as described in Example 2, each of the imaged elements produced a visible printed image for exposures over 600 mJ/cm$^2$. After 2000 impressions, prints from imaged elements 51, 53, 55 and 57 exhibited clean backgrounds free from toning as shown by the print $D_{min}$. This demonstrates that co-polymers with a higher silicone content and longer silicone block length can be used to produce elements useful as waterless plates that can imaged without wiping or processing to produce plates that are resistant to toning.

Example 9

Imagable elements were prepared using infrared absorbers in both layers. The nitrocellulose and carbon imaging layer previously prepared in Example 6 were overcoated with coating solution at 25.4 mL/m$^2$.

| | |
|---|---|
| Co-polymer (20% solution in 50:50 toluene:tetrahydrofuran) | 3.67 g |
| IR Dye 1 (5% solution in 50:50 toluene: methanol) | 1.03 g |
| FC431 (5% solution in toluene) | 0.06 g |
| Toluene | 2.62 g |
| Tetrahydrofuran | 2.62 g |

TABLE 12

| Element | Co-polymer | PDMS (MW) | AA | BB | n | % silicone of co-polymer |
|---|---|---|---|---|---|---|
| 58 | 11B | 13,700 | RMDI | GH | 1 | 95% |
| 59 | 11D | 13,700 | RMDI | GK | 3 | 87% |

Each element was imaged and printed without wiping or wet processing as described above. Each imaged element reproduced the image on the first sheet and were run for 2000 sheets without toning, resulting in a $D_{min}$ of 0.11 and 0.12 for imaged elements 58 and 59, respectively.

Example 10

In this example imagable elements were prepared on a variety of substrates.

| | |
|---|---|
| Co-polymer (20% solution in 50:50 toluene:tetrahydrofuran) | 3.67 g |
| IR Dye 1 (5% solution in 50:50 toluene: methanol) | 1.03 g |
| Toluene | 2.62 g |
| Tetrahydrofuran | 2.62 g |

To coatings 61 and 62 a crosslinker, hexamethylene diisocyanate was added at 5 weight percent of the polymer as a crosslinker.

TABLE 13

| Coating | Copolymer | Dye | Crosslinker | Substrate |
|---|---|---|---|---|
| 60 | 6D | Dye 1 | None | Estar |
| 61 | 6D | Dye 1 | HMDI @ 5% | Estar |
| 62 | 6D | Dye 1 | HMDI @ 5% | Aluminum |

Each element was imaged and printed without wiping or wet processing as described above. Each imaged element reproduced the desired image when printed on a press.

Example 11

This example exemplifies the preparation of a thermally sensitive co-polymer and imaging of an imagable element containing the co-polymer with a thermal head.

A thermally sensitive co-polymer of following formula was prepared.

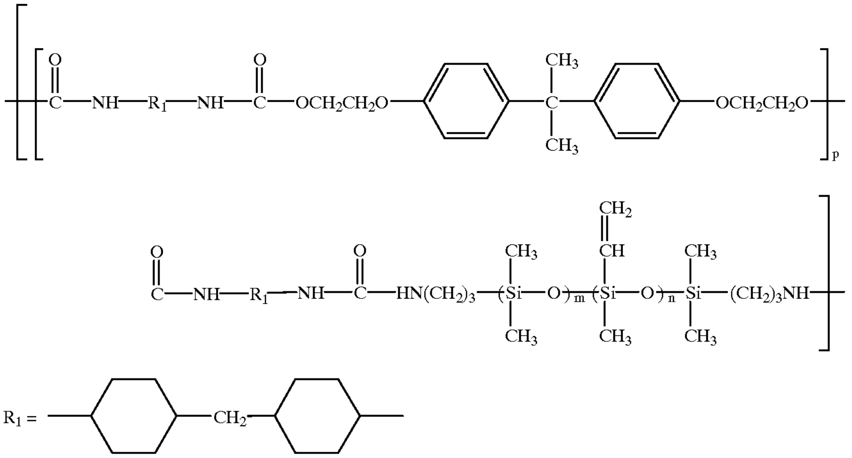

m = 230
n = 1.6 (Average Value)
p = 2
molecular weight = 72,000

A coating solution was prepared by adding 0.84 g of a 19.3% solution of the co-polymer in toluene, 0.81 g of a 0.02% of SIP-6831.0 in acetone, 0.016 g of a 10% solution SIT-7900 in acetone, and 0.04 g of a 10% solution of PS120 in acetone to 12.1 g of acetone. The solution was coated onto 100 micron polyester base using a syringe pump and translating slot hopper. The resulting element was cured in an oven for 10 min at 100° C.

A poly(dimethylsiloxane) control was prepared having the same dry coverage by adding 0.48 g of a 20% solution of PS 448 in dichloromethane, 0.48 g of a 0.02% solution of SIP-6831.0 in dichloromethane, 0.01 g of a 10% solution of SIT-7900 in dichloromethane, and 0.03 g of a 10% solution PS 120 in dichloromethane to 13.5 g of dichloromethane and coated onto 100 micron polyester base using a syringe pump and translating slot hopper at 25.4 mL/$m^2$. The resulting element was cured in an oven for 10 min at 100° C.

A thermal head printer similar to that described in U.S. Pat. No. 5,488,025, column 4 lines 46–53, was used to image the imagable elements. The elements were imaged in a printer equipped with a TDK thermal print head Model No. LV5416, which has a resolution of 118 dots/cm and an average resistance of 3281 ohms. Imagable elements were imaged using a maximum of 18 volts, 17 milliseconds line time, 3.4 kg head weight and a sample stage temperature of 30° C. The test image included solid area patches where head voltage was varied from the 18 volt maximum to zero in 10 even increments. These conditions do not necessarily correspond to the optimum imaging conditions for these elements.

Imaged elements were printed, without wiping or further processing, using a Heidelberg GTO offset press, without the fountain roller or fountain solution. The waterless ink, K50-95932-Black available from INX International Rochester, N.Y., was used. Status density of the ink on paper was measured using an X-Rite Model 938 Spectrodensitometer. The results are summarized in Table 14.

TABLE 14

Print Density vs. Thermal Head Power

| Head Power (Volts) | Co-polymer (o.d.) | PDMS Control (o.d.) |
|---|---|---|
| 18 | 1.453 | 0.431 |
| 16 | 1.338 | 0.220 |
| 14 | 1.445 | 0.237 |
| 12 | 1.438 | 0.100 |
| 10 | 1.395 | 0.064 |
| 8 | 0.821 | 0.061 |
| 6 | 0.433 | 0.062 |
| 4 | 0.066 | 0.062 |
| 2 | 0.066 | 0.062 |
| 0 | 0.063 | 0.061 |

The thermally sensitive co-polymer gives higher $D_{max}$ density at a given thermal head power and has a lower power threshold for the onset of good printing.

Example 12

This example describes preparation of a furan substituted aminopropyl terminated silicones and vinyl substituted aminopropyl terminated silicones and their conversion to co-polymers.

Methallyl chloride (0.85 M) was added to a solution of potassium t-butoxide (0.89 M) and furfuryl alcohol (0.89 M) in dimethyl sulfoxide (0.5 L). The exothermic reaction (~95° C.) was allowed to cool to room temperature over 2 hr and then added to 1.5 L water and extracted with 0.5 L ether. Crude product (125 g) was isolated from the ether phase and distilled at ~20 mm at 127° C. to yield 110 g (0.72 M) of methallyl 2-methylfurfuryl ether. Hydrosilylation of the methallyl group was accomplished by mixing with 0.93 M of dichloromethylsilane, 0.2 g of SIP6831.0 in xylene and heating to a gentle reflux. The reaction proceeded to completion with a brief vigorous reflux.

The product was distilled at 105 to 110° C. and 20 mm pressure to yield 120 g of product. 108 g (0.4 m) of product was dissolved in 0.5 L ether and added slowly to a mixture of 0.2 L ether and sodium bicarbonate (0.92 M) in 0.80 L water. The ether phase was washed with brine, and the ether removed with a rotary evaporator. The remaining oil was distilled from 0.015 M of potassium hydroxide through a short path distillation apparatus at 250° C. and 2 mm. The product (70 g) was identified by GC-MS as a mixture of 3- and 4-member furfuryl ether substituted siloxane rings.

The unsubstituted propyl analogue (R=H) was prepared by the same procedure.

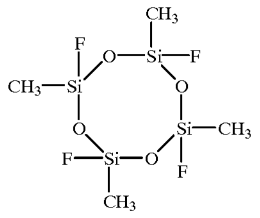

D4 where F =

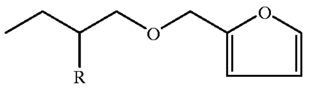

R = $CH_3$ or H

The furan substituted siloxane monomer (15.8 g), cyclooctamethyltetrasiloxane (D4, 27 g), bis-aminopropyltetramethyldisiloxane (BAPS, 4.36 g), and initiator (0.082 g) were mixed and heated under an argon blanket at 85° C. for 6 hr. The initiator was prepared by mixing 2 eq of tetramethyl ammonium hydroxide with 1 eq of BAPS, heating to form a solution, and then drying the salt under vacuum followed by storage in a vacuum dessicator.) Additional D4 (302 g) was then added and heating was continued for 16 hr. The oil was then heated to 150° C. for 40 min, followed by distillation of 22 g of residual cyclics at 4 mm. Titration of the amine end groups showed 0.107 meq/g, which represents a molecular weight of 18,700 or about 250 (n+m) monomer repeat units. H1 NMR showed the composition had one furan repeat unit for every 50 dimethylsiloxane groups or about 5 (n) furan groups per silicone chain. The repeat units are randomly located throughout the chain.

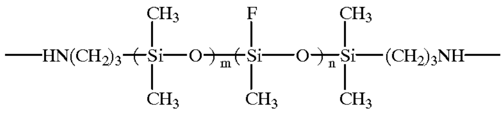

where F =

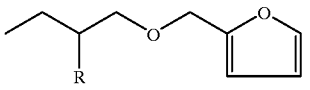

R = $CH_3$ or H

The vinyl substituted aminopropyl terminated silicones were prepared in the same manner using a mixture of cyclooctamethyltetrasiloxane and tetravinyltetramethyltetrasiloxane.

The furan substituted aminopropyl terminated silicone was polymerized with diisocyanates to incorporate hard segments into the structure. In some cases, diols were added to extend the hard segment and unsubstituted aminopropylsilicones were added to extend the soft segment. Polymerization was accomplished by adding a diisocyanate to a mixture of diol and silicone in toluene at 25% solids and heating at 60° C. for 24 hr. Dibutylltin dilaurate was used as the catalyst. The amount of diisocyanate was such that the equivalents of isocyanate groups was 1.0 to 1.05 the equivalents of amine plus diol. In the case where no diol was used, the reaction was shortened to 1 hr and no catalyst was used.

The vinyl substituted silicones were prepared by the same procedure. The structure of the vinyl substituted soft segment is indicted below in which m and p represent the number of each of the repeat units in the segment. The repeat units are randomly located throughout the segment.

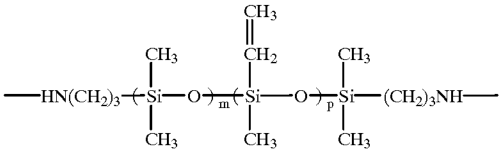

Table 15 presents representative compositions based on furan substituted silicones and mixtures of diisocyanates and diols.

TABLE 15

HARD-SOFT Ureas And Urethanes Based On Mixtures Of Furan Substituted Silicones And Unsubstituted Silicones

| Furan Co- | | Furan PDMS | | | PDMS | | | |
|---|---|---|---|---|---|---|---|---|
| polymer | R | m | n | Wt. % | m | Wt. % | Isocyanate | Diol |
| A | H | 193 | 5 | 93% | | 0% | RMDI | AE |
| B | CH3 | 250 | 5 | 93% | | 0% | RMDI | AE |
| C | H | 193 | 5 | 99% | | 0% | MDI | |
| D | H | 193 | 5 | 93% | 12 | 4% | MDI | |
| E | H | 193 | 5 | 99% | | | PDI | |

The non silicone isocyanate and diol HARD content is 100% minus the total of the two silicones wt %.

Table 16 presents representative compositions based on vinyl substituted silicones and mixtures of diisocyanates and diols.

TABLE 16

HARD-SOFT Ureas And Urethanes Based On Mixtures Of Vinyl Substituted Silicones And Unsubstituted Silicones

| Vinyl | Vinyl PDMS | | | PDMS | | | |
|---|---|---|---|---|---|---|---|
| Copolymer | m | p | Wt. % | m | Wt. % | Isocyanate | Diol |
| F | 230 | 1.6 | 92% | | 0% | RMDI | AE |
| G | 230 | 1.6 | 99% | | | RMDI | |
| H | 230 | 1.6 | 99% | | | MDI | |
| I | 230 | 1.6 | 92% | 12 | 5% | RMDI | |
| J | 230 | 1.6 | 92% | 12 | 5% | MDI | |
| K | 4 | 4.7 | 5% | 270 | 93% | RMDI | |
| L | 4 | 4.7 | 5% | 270 | 93% | MDI | |

The non-silicone isocyanate and diol HARD content is 100% minus the total of the two silicones wt %, p is an average value.

Example 13

This example describes preparation of maleimide substituted silicone segments.

Bisaminopropyltetramethyldisiloxane (0.04 M) was added to a 55 mL dimethyl acetamide solution of maleic anhydride (0.10 M). After 24 hr, acetic anhydride (0.44 M) and 0.45 g of Tyzor® TBT were added followed by 4 hr of heating at 80° C. The product was isolated by precipitation with ice water. Several recrystallizations from heptane gave colorless BM product. (mp=53 to 57° C.).

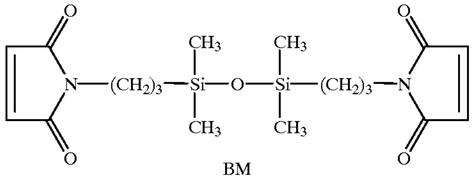

BM

Aminopropylmethyldiethoxysilane (0.69 M) was added to a 520 mL solution of maleic anhydride (0.85 M). After 24 hr, acetic anhydride (3.9 M) and 4.5g of Tyzor® TBT were added, the solution was heated for 4 hr at 80° C. followed by distillation of 170 g of excess anhydride at reduced pressure. The solution was treated with 400 mL of absolute ethanol and 1 g of trifluoroacetic acid for 24 hr. The product was extracted with 2.2 L of hexane, washed with 5% potassium carbonate and distilled at 120° C. and 1 mm to give 184 g of diethoxymaleimidopropylmethylsiloxane. Cyclization was achieved by mixing 20 g with 9 g water, 9 g ethanol and 0.07 g p-toluenesulfonic acid. The solution was heated to 120° C. and reduced pressure for 0.5 hr to form a clear single phase. The oil was dissolved in 150 mL dichloromethane, filtered, washed with 5% potassium carbonate, dried over magnesium sulfate, and filtered. Gel permeation chromatography and liquid chromatography-mass spectroscopy analysis showed a mixture of 3, 4, 5 and 6 member rings with 4 being the dominant component.

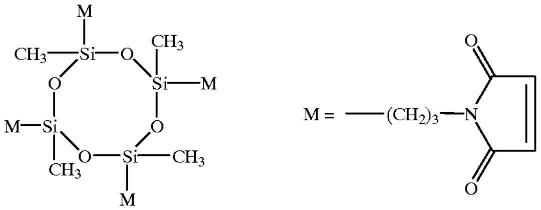

CM

A linear siloxane substituted with maleimides was prepared in a similar fashion. Diisopropoxymaleimidomethylsiloxane (5 mmole), dimethoxydimethylsilane (81 mmole), ethoxytrimethylsilane (1 mmole), water (3.6 g) and p-toluene-sulfonic acid (0.01 g) were mixed to form a solution. The solution was heated at 105° C. followed by 150° C. for 20 min. and 165° C. for 1 hr with argon sparging. The oil was dissolved in dichloromethane, washed with 5% sodium bicarbonate, dried with magnesium sulfate, filtered, stripped of solvents and extracted with methanol to remove cyclic impurities. The yield was 2.0 g of an oil. GPC indicated a Mw of 79,000. NMR showed one maleimide unit for every 14 dimethysiloxanes. The maleimide group is randomly located in the chain.

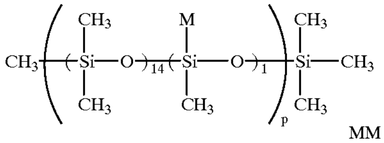

MM

-continued

M =

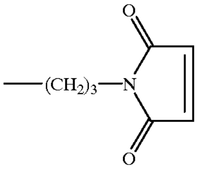

Example 14

This example illustrates preparation and physical properties of the furan/maleimide co-polymers.

Toluene solutions of the furan substituted silicone copolymers listed in Table 15 were mixed with BM and CM such that the equivalents of furan and maleimide were equal. Toluene solutions of the vinyl substituted co-polymers listed in Table 16 were mixed with PS 120 and a catalytic amount of SIP 6831. The solutions were coated onto a 100 μm polyester support to give a final layer thickness of about 2 μ. Dried samples of polymers were isolated by casting small puddles of the solutions onto a Teflon® coated support. The coatings and samples were allowed to dry and cure for 4 days.

The coatings were tested for physical robustness by contacting them with a thin sheet of interleaving paper and applying pressure to the surface with a roller device six times. Samples were rated by holding them up to a light and looking for haziness due to embossing from the paper sheet.

The co-polymer samples were evaluated for thermal sensitivity. The co-polymer residue after heating to 800 to 1,000° C. was measured by thermogravimetric analysis. A low residue indicated facile thermal breakdown and removal. The results are collected in Tables 17, 18, 19 and 20.

TABLE 17

Examples Of Furan Substituted Silicones Crosslinked With BM and CM For Thermal Breakdown And Film Robustness

| Example | Furan Segment | Maleimide Crosslinker | THF Solubility | Roller Test | TGA Residue |
|---|---|---|---|---|---|
| E1 | B | BM | swell | good | 5% |
| E2 | B | CM | swell | excellent | 5% |
| E3 | C | BM | swell | excellent | 2% |
| B4 | C | CM | swell | excellent | 6% |
| E5 | D | BM | swell | excellent | 3% |
| E6 | D | CM | swell | excellent | 7% |

TABLE 18

Comparative Examples Of Uncrosslinked Furan Substituted Silicones For Thermal Breakdown And Film Robustness

| Comparative Example | Furan Segment | Maleimide Crosslinker | THF Solubility | Roller Test | TGA Residue |
|---|---|---|---|---|---|
| C1 | B | none | soluble | poor | 1% |
| C2 | C | none | soluble | poor | |
| C3 | D | none | soluble | poor | |

TABLE 19

Comparative Examples of Uncrosslinked Vinyl Substituted Silicones For Thermal Breakdown And Film Robustness

| Comparative Example | Vinyl Segment | % PS120 | THF Solubility | Roller Test | TGA Residue |
|---|---|---|---|---|---|
| C4 | F | 0 | soluble | poor | 3% |
| C5 | G | 0 | soluble | poor | 0% |
| C6 | H | 0 | soluble | poor | 0% |
| C7 | I | 0 | soluble | poor | 0% |
| C8 | J | 0 | soluble | poor | 1% |
| C9 | K | 0 | soluble | poor | 0% |
| C10 | L | 0 | soluble | poor | 1% |

TABLE 20

Comparative Examples of Vinyl Substituted Silicones Crosslinked With PS120 For Thermal Breakdown And Film Robustness

| Comparative Example | Vinyl Segment | % PS120 | THF Solubility | Roller Test | TGA Residue |
|---|---|---|---|---|---|
| C11 | F | 8 | swell | excellent | 51% |
| C12 | G | 8 | swell | excellent | 71% |
| C13 | H | 8 | swell | excellent | 61% |
| C14 | I | 8 | swell | excellent | 62% |
| C15 | J | 8 | swell | excellent | 51% |
| C16 | K | 8 | swell | excellent | 54% |
| C17 | L | 8 | swell | excellent | 37% |

Example 15

An ink receptive substrate was prepared by adding 11.0 g. of a 10% solution of Estane® 5755 (B.F. Goodrich) in 2-butanone, 6.60 g of a 5% solution of IR dye 1 in methanol, and 7.4 g of 2-butanone, and coating at 37.66 $mL/m^2$ onto a 100 μm polyester base using a hopper coating device.

An imagable element was prepared by coating 37.66 $mL/m^2$ of a solution containing 6.16 g of a 16.3% solution of polymer B in toluene, 0.47 g of a 10% solution of crosslinker BM in acetone, 4.02 g of a 5% solution of IR dye 1 in 50:50 toluene: methanol, 4.2 g of 2-butanone, and 5.15 g of toluene onto the ink receptive substrate using a hopper coating device. A comparative imagable element was prepared by coating 37.66 $mL/m^2$ of a solution containing 5.54 g of a 18.2% solution of polymer F in toluene, 0.69 g of a 0.02% solution SIP 6831, 1 drop of methyl pentynol (Aldrich), 0.70 g of a 10% solution of PS120 in toluene, 4.01 g of a 5% solution of IR dye 1 in 50:50 toluene: methanol, 4.1 g of 2-butanone, and 4.95 g of toluene, and coating at 37.66 mL/mm onto the ink receptive substrate using a hopper coating device. The imagable elements were cured in an oven for 10 min at 100° C.

Three days after coating, the imagable elements were evaluated for adhesion by rubbing with moderate pressure. Elements that resisted smudging were rated as good for adhesion. Those that showed smudging were rated as fair. Those that showed peeling were rated as poor.

Three days after coating the imagable elements were imagewise exposed using a focused diode laser beam at 830 nm using the apparatus described above. The exposure level was about 2000 $mJ/cm^2$, and the intensity of the beam was about 3 $mW/\mu m^2$. The laser beam was modulated to produce a halftone dot image. After exposure, the exposed imagable element was mounted on a Heidelberg GTO press and used to make several thousand clean impressions without wear using black waterless ink K50-95932. The 50% dot areas were measured using a densitometer after 100 impressions and 6,000 impressions.

The results of the adhesion and printing are described in Table 21 below. The elements containing thermally sensitive co-polymer B more closely produced the desired 50% dot image at equal adhesion.

TABLE 21

Comparison of Adhesion and Printing Results

| Ink repellent Co-polymer | Adhesion | 50% dot value 100 sheets | 50% dot value 6000 sheets |
|---|---|---|---|
| Co-polymer B, thermally sensitive | Good | 48% | 52% |
| Co-polymer F, thermally stable | Good | 43% | 42% |

Example 16

An ink receptive substrate was prepared by adding 10.55 g of a 10% solution of CA2237 (Morton International) in 2-butanone, 2.197 g of a 12% solution of 5–6 second nitrocellulose in 2-butanone, 5.27 g of a 5% solution of IR dye 3 in 75:25 acetone:cyclopentanone, and 6.98 g of 2-butanone, and coating at 56.49 mL/$m^2$ onto a 100 $\mu$m polyester support using a hopper coating device.

An imagable element was prepared by coating 37.66 mL/$m^2$ of a solution containing 11.185 g of a 16.3% solution of polymer B in toluene, 0.85 g of a 10% solution of crosslinker BM in acetone, 7.292 g of a 5% solution of IR dye 2 in 90:10 acetone:diacetone alcohol, 12.54 g of acetone, and 3.14 g of toluene onto the ink receptive substrate using a hopper coating device. A comparative imagable element was prepared by coating 37.66 mL/$m^2$ of a solution containing 9.63 g of a 18.2% solution of polymer F in toluene, 1.21 g of a 0.02% solution of SIP 6831 in toluene, 0.024 g of methyl pentynol (Aldrich), 0.910 g of a 10% solution of PS120 in toluene, 7.292 g of a 5% solution of IR dye 3 in 90:10 acetone:diacetone alcohol, 12.75 g of acetone, and 3.187 g of toluene onto the ink receptive substrate using a hopper coating device. The imagable elements were cured in an oven for 10 min at 100° C.

Four days after coating, the imagable elements were evaluated as described in Example 15. The results of the adhesion and printing are described in Table 22. The element containing thermally sensitive co-polymer B more closely produced the desired 50% dot image at equal adhesion.

TABLE 22

Comparison of Adhesion and Printing Results

| Ink Repellent Co-polymer | Adhesion | 50% dot value 100 sheets |
|---|---|---|
| Co-polymer B thermally sensitive | Good | 49% |
| Co-polymer F thermal stable | Good | 21% |

Having described the invention, we now claim the following and their equivalents.

What is claimed is:

1. A process for producing a lithographic printing plate, the process comprising:

thermally imaging an imageable element, the element comprising:

(a) an ink receptive substrate; and (b) an ink repellent, thermally sensitive surface layer overlying the substrate, the layer comprising an ink repellent, thermally sensitive co-polymer;

in which:

the thermally sensitive co-polymer comprises one or more silicone segments and one or more hard segments;

the silicone segments comprise 50 to 98 weight percent of the thermally sensitive co-polymer; the hard segments provide physical integrity and thermal sensitivity to the thermally sensitive co-polymer; and either (1) no layer overlies the ink repellent, thermally sensitive surface layer or (2) a slipping layer removable by a printing operation overlies the ink repellent, thermally sensitive surface layer.

2. The process of claim 1 in which the hard segments are capable of breaking down under the influence of heat to render the exposed regions of the thermally sensitive surface layer removable without wiping.

3. The process of claim 2 in which the silicone segments comprise:

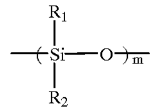

in which m is 20 to 10,000; and $R_1$ and $R_2$ are independently methyl, phenyl, fluoroalkyl, or cyanoalkyl.

4. The process of claim 3 in which the hard segments comprise polyurethane segments.

5. The process of claim 3 in which the silicone segments comprise:

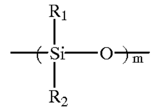

in which m is 20 to 10,000; and $R_1$ and $R_2$ are methyl.

6. The process of claim 5 in which the hard segments comprise polyurethane segments.

7. The process of claim 6 in which the thermally sensitive co-polymer contains from about 80% by weight to about 98% by weight of silicone segments.

8. The process of claim 3 in which $R_1$ and $R_2$ are methyl.

9. The process of claim 2 in which the thermally sensitive co-polymer comprises repeat units of the following formula:

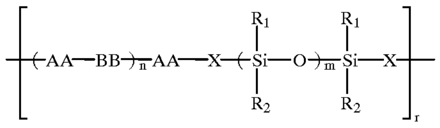

in which AA and BB together form a polyurethane segment; n is about 2 to about 5; $R_1$ and $R_2$ are methyl; m is about 150 to about 200; r is 1 to about 50; and X is an alkyl amine moiety containing one to six carbon atoms.

10. The process of claim 9 in which n is about 3; m is about 185; the diisocyanate is 4,4'-dicyclohexylmethane diisocyanate, the bisphenol is 4,4'-(octahydro-4,7-methano-5H-inden-5-ylidene)bisphenol; and X is $—CH_2CH_2CH_2NH—$.

11. The process of claim 10 in which the thermally sensitive co-polymer contains from about 80% by weight to about 98% by weight of silicone segments.

12. The process of claim 2 in which the imagable element is imaged by a thermal head.

13. The process of claim 12 in which the thermally sensitive co-polymer comprises repeat units of the following formula:

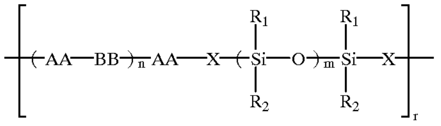

in which AA and BB together form a polyurethane segment; n is about 2 to about 5; $R_1$ and $R_2$ are methyl; m is about 150 to about 200; r is 1 to about 50; X is an alkyl amine moiety containing one to six carbon atoms; and the thermally sensitive co-polymer contains from about 60% by weight to about 95% by weight of silicone segments.

14. The process of claim 2 in which at least one layer of the imagable element or the substrate absorbs infrared radiation and in which the imagable element is imaged by imagewise exposure with modulated infrared radiation.

15. The process of claim 14 in which no layer overlies the ink repellent, thermally sensitive surface layer.

16. The process of claim 15 in which the thermally sensitive co-polymer comprises repeat units of the following formula:

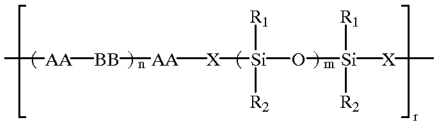

in which AA and BB together form a polyurethane segment; n is about 2 to about 5; $R_1$ and $R_2$ are methyl; m is about 150 to about 200; r is 1 to about 50; X is an alkyl amine moiety containing one to six carbon atoms; and the thermally sensitive co-polymer contains from about 80% by weight to about 98% by weight of silicone segments.

17. The process of claim 1 in which the thermally sensitive co-polymer additionally comprises linking groups between the silicone segments and the hard segments.

18. A process for producing a lithographic printing plate, the process consisting essentially of:

thermally imaging an imageable element, the element comprising:

(a) an ink receptive substrate; and (b) an ink repellent, thermally sensitive surface layer overlying the substrate, the layer comprising an ink repellent, thermally sensitive co-polymer;

in which:

the thermally sensitive co-polymer comprises one or more silicone segments and one or more hard segments;

the silicone segments comprise 50 to 98 weight percent of the thermally sensitive co-polymer;

the hard segments provide physical integrity and thermal sensitivity to the thermally sensitive co-polymer; and the hard segments are capable of breaking down under the influence of heat to render imaged regions of the thermally sensitive surface layer removable without wiping.

19. The process of claim 18 in which the silicone segments comprise:

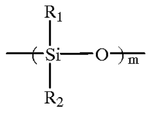

in which m is 20 to 10,000; and $R_1$ and $R_2$ are independently methyl, phenyl, fluoroalkyl, or cyanoalkyl.

20. The process of claim 19 in which the hard segments comprises polyurethane segments.

21. The process of claim 18 in which the thermally sensitive co-polymer additionally comprises linking groups between the silicone segments and the hard segments.

22. The process of claim 18 in which the silicone segments comprise:

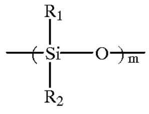

in which m is 20 to 10,000; and $R_1$ and $R_2$ are methyl.

23. The process of claim 22 in which the hard segments comprise polyurethane segments.

24. The process of claim 23 in which the thermally sensitive co-polymer contains from about 80% by weight to about 98% by weight of silicone segments.

25. The process of claim 18 in which the thermally sensitive co-polymer comprises repeat units of the following formula:

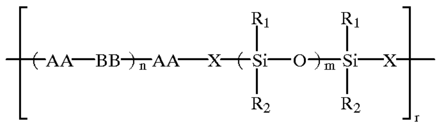

in which AA and BB together form a polyurethane segment; n is about 2 to about 5; $R_1$ and $R_2$ are methyl; m is about 150 to about 200; r is 1 to about 50; and X is an alkyl amine moiety containing one to six carbon atoms.

26. The process of claim 25 in which the thermally sensitive co-polymer contains from about 80% by weight to about 98% by weight of silicone segments.

27. The process of claim 18 in which the imagable element is imaged by a thermal head.

28. The process of claim 27 in which the thermally sensitive co-polymer comprises repeat units of the following formula:

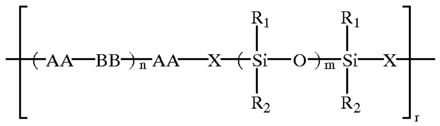

in which AA and BB together form a polyurethane segment; n is about 2 to about 5; $R_1$ and $R_2$ are methyl; m is about 150 to about 200; r is 1 to about 50; and X is an alkyl amine moiety containing one to six carbon atoms; and the thermally sensitive co-polymer contains from about 60% by weight to about 95% by weight of silicone segments.

29. The process of claim 18 in which at least one layer of the imagable element or the substrate absorbs infrared radiation and in which the imagable element is imaged by imagewise exposure with modulated infrared radiation.

30. The process of claim 29 in which the thermally sensitive co-polymer comprises repeat units of the following formula:

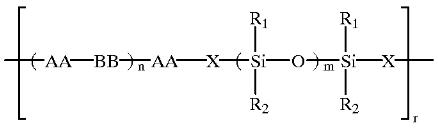

in which AA and BB together form a polyurethane segment; n is about 2 to about 5; $R_1$ and $R_2$ are methyl; m is about 150 to about 200; r is 1 to about 50; and X is an alkyl amine moiety containing one to six carbon atoms; and the thermally sensitive co-polymer contains from about 80% by weight to about 98% by weight of silicone segments.

31. The process of claim 18 in which $R_1$ and $R_2$ are methyl.

* * * * *